United States Patent
Yang et al.

(10) Patent No.: US 10,636,494 B2
(45) Date of Patent: Apr. 28, 2020

(54) APPARATUS AND METHOD FOR REDUCING NOISE GENERATED FROM LOCKED OUT SENSE CIRCUITS IN A NON-VOLATILE MEMORY SYSTEM

(71) Applicant: SanDisk Technologies LLC, Plano, TX (US)

(72) Inventors: Xiang Yang, Clara, CA (US); Stanley Jeong, Dublin, CA (US); Wei Zhao, Fremont, CA (US); Huai-yuan Tseng, San Ramon, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/908,239

(22) Filed: Feb. 28, 2018

(65) Prior Publication Data

US 2019/0267096 A1    Aug. 29, 2019

(51) Int. Cl.
*G11C 16/24* (2006.01)
*G11C 7/08* (2006.01)
*G11C 16/34* (2006.01)
*G11C 16/26* (2006.01)

(52) U.S. Cl.
CPC ........... *G11C 16/24* (2013.01); *G11C 7/08* (2013.01); *G11C 16/26* (2013.01); *G11C 16/3436* (2013.01)

(58) Field of Classification Search
CPC ........... G11C 16/24; G11C 7/08; G11C 16/26; G11C 16/3436
See application file for complete search history.

(56) References Cited

U.S. PATENT DOCUMENTS

| | | | |
|---|---|---|---|
| 6,301,175 B1 * | 10/2001 | Seyyedy | G11C 7/065 365/149 |
| 7,593,265 B2 | 9/2009 | Nguyen et al. | |
| 7,978,526 B2 | 7/2011 | Nguyen et al. | |
| 9,208,895 B1 * | 12/2015 | Huynh | G11C 16/24 |
| 2009/0168540 A1 * | 7/2009 | Nguyen | G11C 7/02 365/185.21 |
| 2016/0078929 A1 * | 3/2016 | Maejima | G11C 16/3459 365/185.03 |
| 2016/0372205 A1 * | 12/2016 | Amarnath | G11C 16/26 |
| 2018/0366178 A1 * | 12/2018 | Amarnath | G11C 16/26 |
| 2019/0103145 A1 * | 4/2019 | Tseng | G11C 16/08 |

* cited by examiner

*Primary Examiner* — Mushfique Siddique
(74) *Attorney, Agent, or Firm* — Vierra Magen Marcus LLP

(57) ABSTRACT

A circuit includes selected sense circuits configured to be connected to selected bit lines and unselected sense circuits configured to be connected to unselected bit lines during a sense operation. When the sense circuit is connected to the unselected bit line during the sense operation, the sense circuit is locked out in order to reduce current consumption. However, noise from the locked out sense circuit may be transmitted to the sense circuits connected to the selected bit lines through adjacent bit line coupling. In order to reduce the effect of the noise, charge transfer from the sense node may be blocked from passing to the unselected bit lines. Or, charge may be drained from the sense node, thereby preventing the charge from passing to the unselected bit lines.

18 Claims, 23 Drawing Sheets

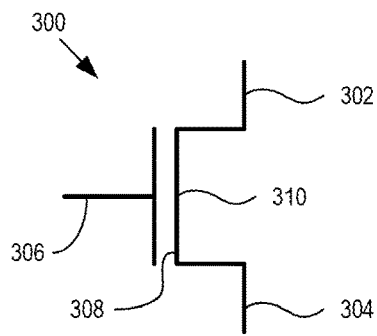
FIG. 3
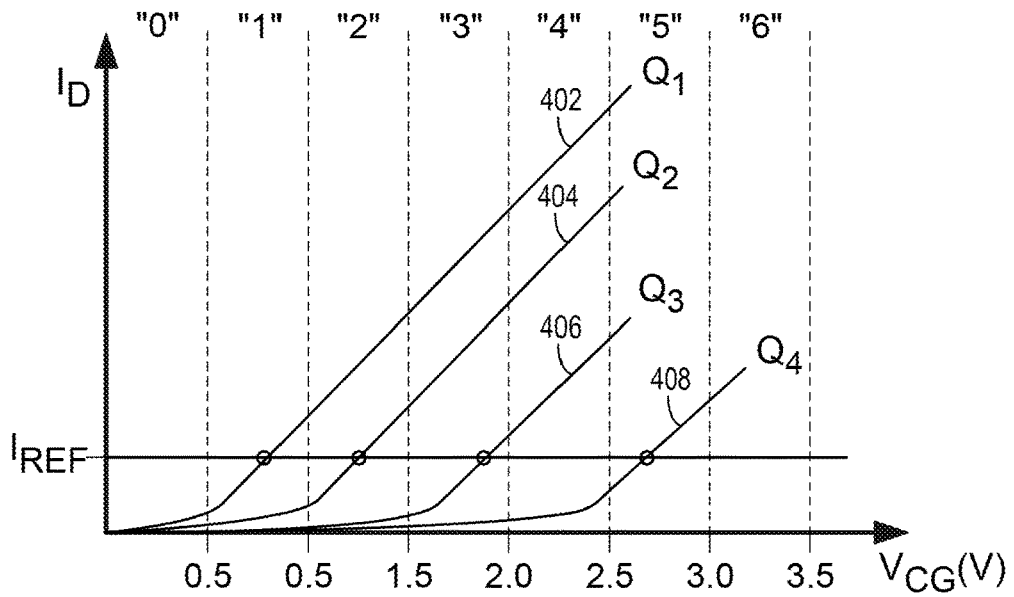
FIG. 4
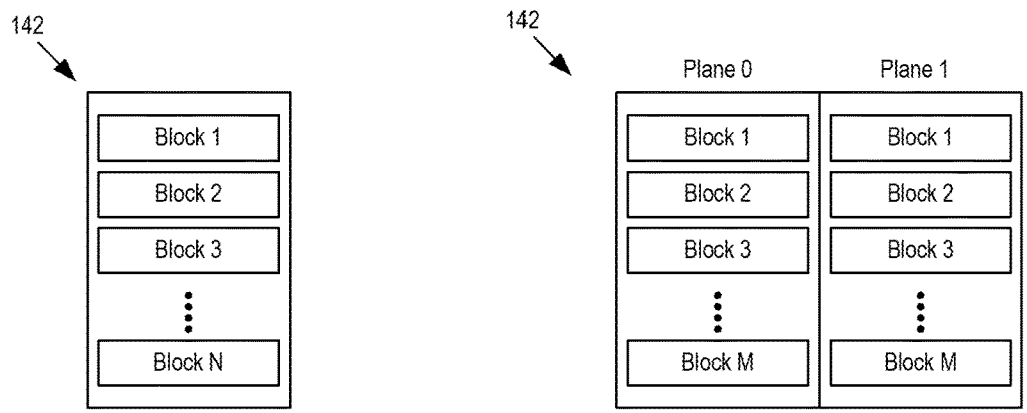
FIG. 5A
FIG. 5B

APPARATUS AND METHOD FOR REDUCING NOISE GENERATED FROM LOCKED OUT SENSE CIRCUITS IN A NON-VOLATILE MEMORY SYSTEM

BACKGROUND

In storage devices, sense amplifiers are included on memory dies to sense current flowing through bit lines in order to determine the data values of the data that memory cells are storing or in order to verify that data has been correctly programmed into the memory cells. During a sense operation, some bit lines of a block are selected while others are unselected.

Whether a given bit line is selected or unselected may depend on whether a sense circuit desires to know the current flow through that bit line. In particular, in the event that the circuit has verified that the cells in a first group of bit lines have been correctly programmed, the circuit may unselect the first group of bit lines (thereby reducing current flow through the first group of bit lines and effectively locking out the first group of bit lines) while selecting a second group of bit lines for verification. Thus, locking out the first group of bit lines may save power by reducing current usage; however, the lockout of the first group of bit lines may cause noise when verifying the voltages in the cells on the second group of bit lines.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3 is a circuit diagram of an example floating gate transistor.

FIG. 4 is a graph of curves of drain-to-source current as a function of control gate voltage drawn through a floating gate transistor.

FIG. 5A is a block diagram of a plurality of memory cells organized into blocks.

FIG. 5B is a block diagram of a plurality of memory cells organized into blocks in different planes.

FIG. 10A is a plot of threshold voltage distribution curves for memory cells storing two bits of data.

FIG. 10B is a plot of threshold voltage distribution curves for memory cells storing three bits of data.

FIG. 10C is a plot of threshold voltage distribution curves for memory cells storing four bits of data.

DETAILED DESCRIPTION

Figure 1A:
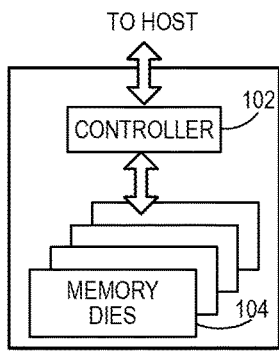
FIG. 1A is a block diagram of an exemplary non-volatile memory system.

The following embodiments describe apparatuses, devices, systems, circuits, and methods for reducing noise, generated from a locked out sense circuit, from propagating to a selected sense circuit. In one embodiment, a circuit includes a sense amplifier circuit configured to connect to an unselected bit line. The sense amplifier circuit includes: sense node charge circuitry configured to charge a sense node; isolation circuitry configured to isolate the sense node from a communication node; and sense node isolation control circuitry configured to control the isolation circuitry in order to isolate the sense node from the communication node, where the control is dependent on the connection of the sense amplifier circuit to the unselected bit line.

In some embodiments, the sense node isolation control circuitry is configured to output a state-dependent control signal to the isolation to control the isolation circuitry.

In some embodiments, the sense amplifier circuit is configured to receive a lockout signal indicative of locking out the sense amplifier circuit, and the sense node isolation control circuitry is configured to generate the state-dependent control signal based on the lockout signal.

In some embodiments, the sense node isolation control circuitry includes a level shifter configured to receive the lockout signal.

In some embodiments, the sense node isolation control circuitry further includes an inverter circuit coupled to an output of the level shifter circuit and configured to generate the state-dependent control signal.

In some embodiments, the sense node isolation control circuitry includes a multiplexer configured to receive the lockout signal at a select input, and output the state-dependent control signal based on a level of the lockout signal.

In some embodiments, a latch circuit, in communication with the sense amplifier circuit, is configured to generate a state-dependent voltage in response to the sense amplifier circuit connected to the unselected bit line, and output the state-dependent voltage to the sense node isolation control circuitry.

In some embodiments, the state-dependent voltage includes an unselect voltage, and the latch circuit is configured to generate the unselect voltage at an associated high level in response to the sense amplifier circuit connected to the unselected bit line, and generate the unselect voltage at an associated low level in response to the sense amplifier circuit connected to a selected bit line.

In another embodiment, a circuit includes a sense amplifier circuit configured to connect to an unselected bit line. The sense amplifier circuit includes: sense node charge circuitry configured to charge a sense node; a sense enable circuit configured to form a charge-sharing relationship between the sense node and the communication node; and sense node drain circuitry configured to drain charge at the sense node dependent on the sense node charge circuitry charging the sense node and connection of the sense amplifier circuit to the unselected bit line.

In some embodiments, the sense node drain circuitry is connected between the sense node and the sense enable circuit.

In some embodiments, the sense node drain circuitry includes a first terminal connected between the sense node and the sense enable circuit and a second terminal connected to ground.

In some embodiments, a latch circuit, in communication with the sense amplifier circuit, is configured to: generate a lockout signal indicative of locking out the sense amplifier circuit; and activate the sense node drain circuitry with the lockout signal.

In some embodiments, the sense node drain circuitry includes a transistor, and the latch circuit is configured to input the lockout signal to a gate of the transistor.

In some embodiments, the lockout signal includes an unselect voltage, and the latch circuit is configured to generate the unselect voltage at an associated high voltage level in response to the sense amplifier circuit connected to the unselected bit line.

In some embodiments, the sense node drain circuit is configured to drain the charge at the sense node in response to the sense node charge circuitry receiving a voltage pulse.

In some embodiments, the sense node charge circuitry is configured to electrically connect the sense node to ground prior to receipt of the voltage pulse.

In another embodiment, a system includes a plurality of sense circuits, where each sense circuit of the plurality of sense circuits is configured to connect to a respective one of a plurality of bit lines of a memory block. The plurality of sense circuits includes: a first sense amplifier circuit that includes a first sense capacitor, and circuitry configured to connect the first sense capacitor to a selected bit line of the plurality of bit lines during a sense. The plurality of sense circuits further includes a second sense amplifier circuit that includes a second sense capacitor, circuitry configured to connect the second sense capacitor to an unselected bit line of the plurality of bit lines during the sense operation, and a drain transistor configured to drain the second sense capacitor dependent on connecting the second sense circuit to the unselected bit line and charging the second sense capacitor.

In some embodiments, the second sense capacitor is configured to receive a voltage pulse during the sense operation, and the drain transistor is configured to drain the second sense capacitor in response to receipt of the voltage pulse.

In some embodiments, the second sense capacitor is configured to drain the second sense capacitor in response to receipt of the second control signal.

In some embodiments, a latch circuit is configured to generate the second control signal.

In some embodiments, the drain transistor includes a first drain transistor, and the first amplifier circuit further comprises a second drain transistor configured to turn off in response to receipt of the first control signal.

In another embodiment, a circuit includes: means for charging a sense node of a sense amplifier circuit; means for isolating the sense node from a communication node of the sense amplifier circuit; and means for controlling the means for isolating the sense node from the communication node, where the means for controlling is dependent on the sense amplifier circuit connected to an unselected bit line.

Other embodiments are possible, and each of the embodiments can be used alone or together in combination. Accordingly, various embodiments will now be described with reference to the attached drawings.

The following embodiments describe apparatuses, devices, systems, circuits, and methods for reducing noise, generated from a locked out sense circuit, from propagating to a selected sense circuit. The embodiments may include circuitry to either block charge transfer from a sense node in the locked out sense circuit propagating to the selected sense circuit. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure that they are operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s) 104, even if a single channel is shown in the drawings.

Figure 1B:
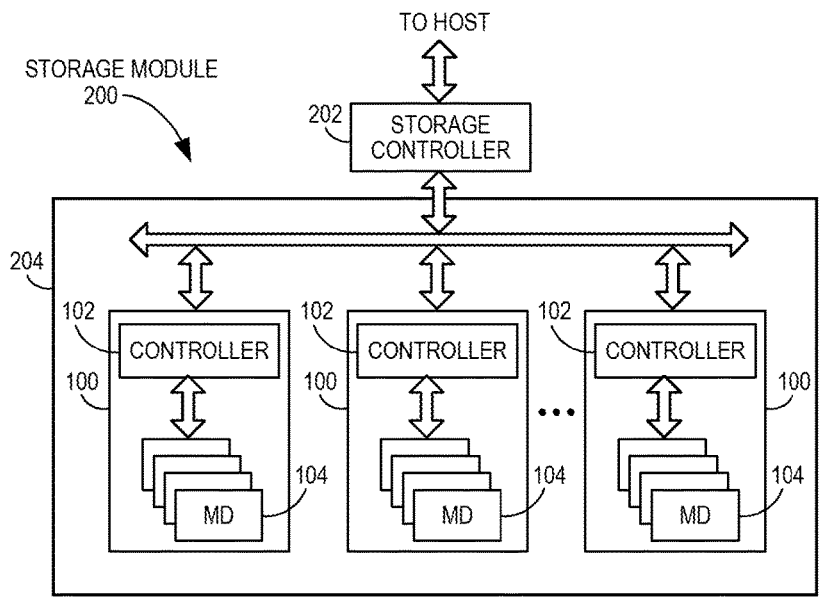
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
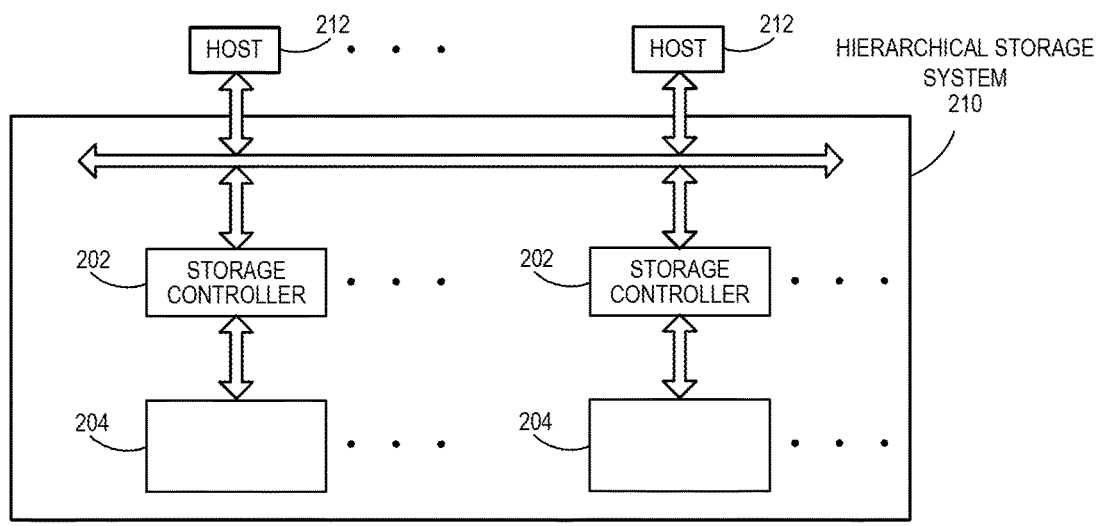
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
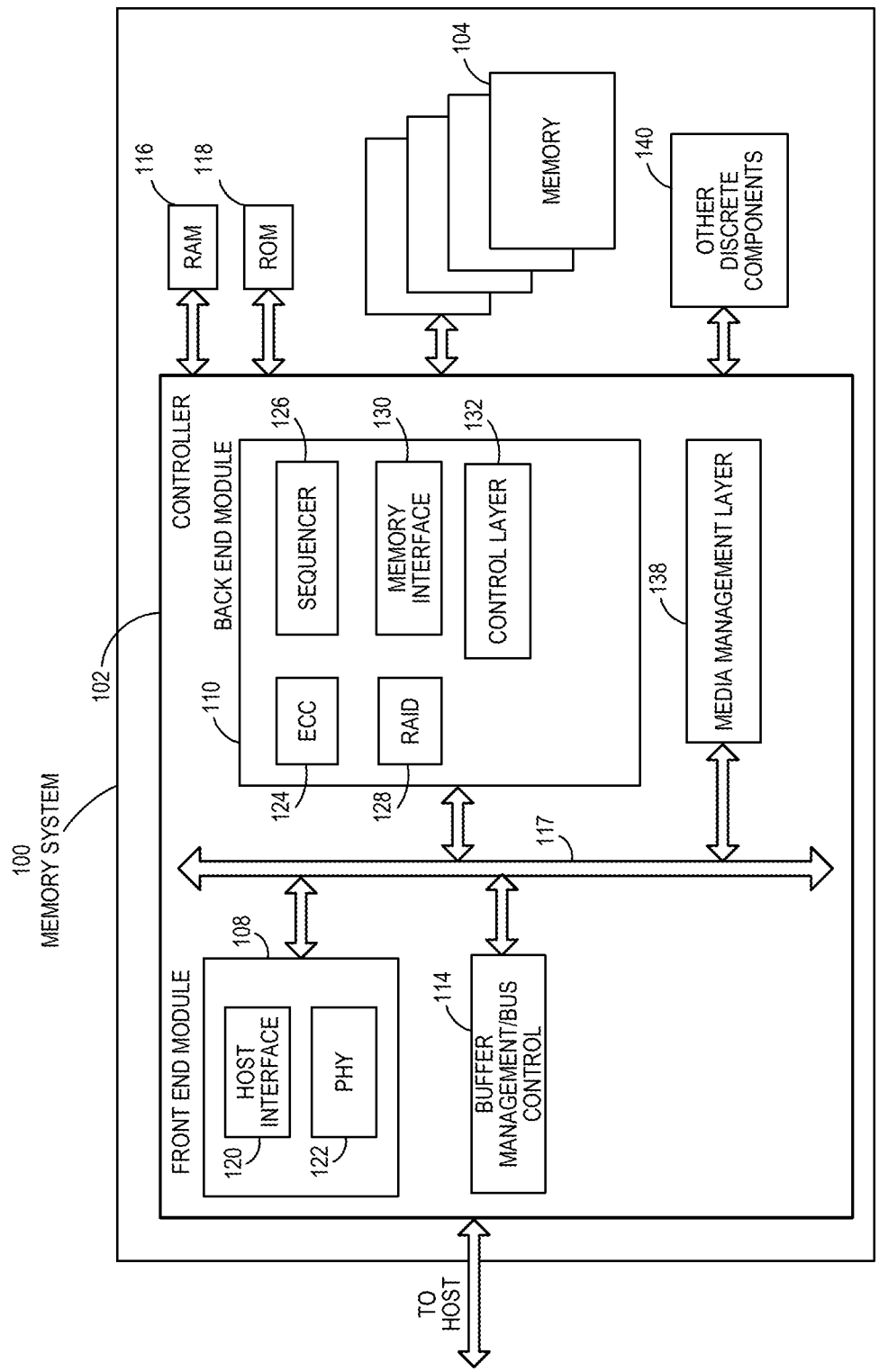
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
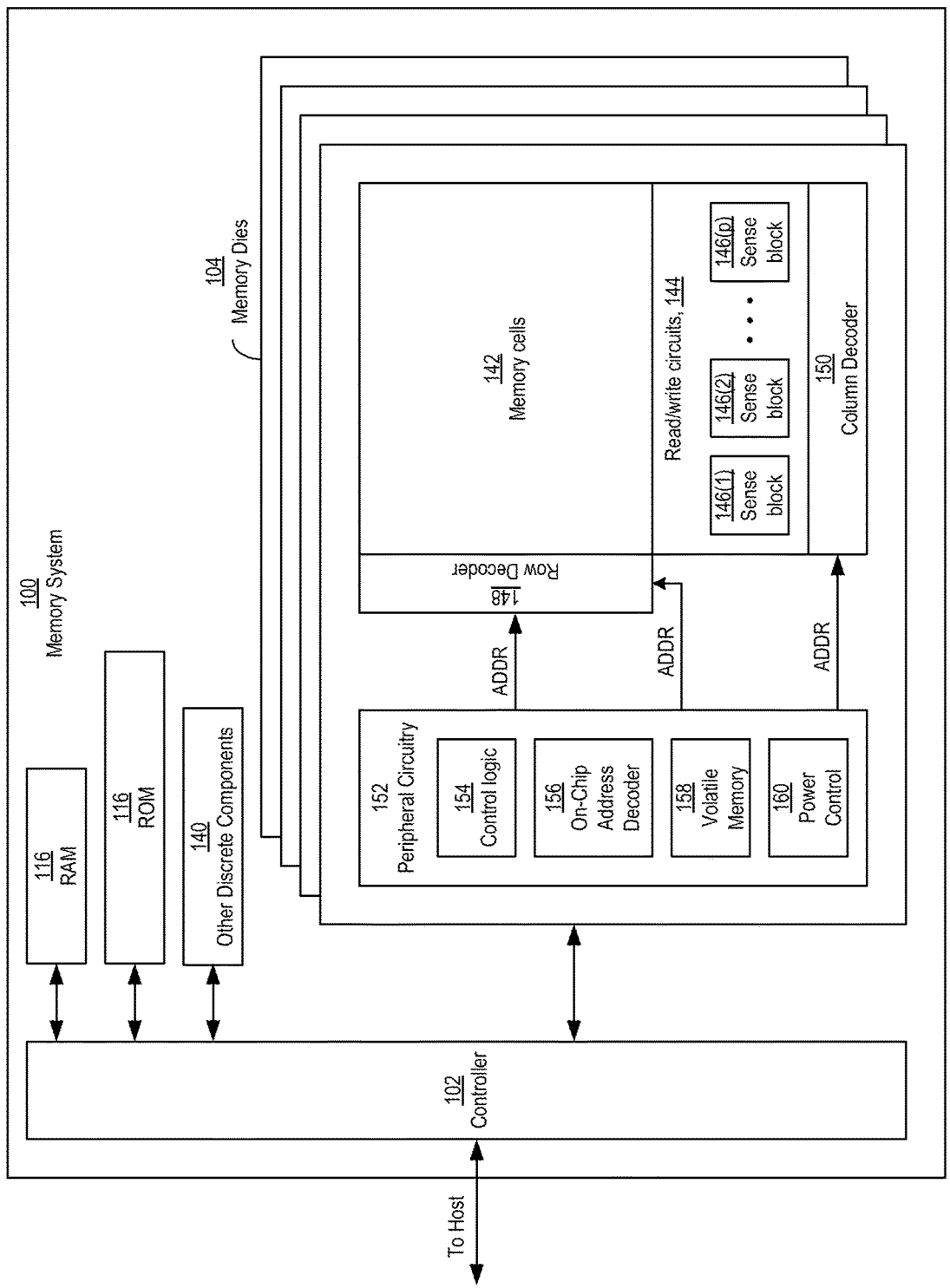
FIG. 2B is a block diagram of exemplary components of a non-volatile memory die of the non-volatile memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

For some memory configurations, such as flash memory, a memory cell of the plurality of memory cells 142 may be a floating gate transistor (FGT). FIG. 3 shows a circuit schematic diagram of an example FGT. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. For each given charge stored in the floating gate 308, a corresponding drain-to-source conduction current ID with respect to a fixed control gate Voltage $V_{CG}$ applied to the control gate 306 occurs. Additionally, the FGT 300 may have an associated range charges that can be programmable onto its floating gate 308 that define a corresponding threshold voltage window or a corresponding conduction current window. In this way, the FGT's threshold voltage may be indicative of the data stored in the memory cell.

FIG. 4 is graph showing four curves 402, 404, 406, 408 of drain-to-source current ID drawn through the FGT 300 as a function of a control gate voltage $V_{CG}$ applied to the control gate 306. Each curve 402-408 corresponds to a respective one of four different charges or charge levels Q1, Q2, Q3, Q4 that the floating gate 308 can selectively store at any given time. Otherwise stated, the four curves 402-408 represent four possible charge levels that can be programmed on the floating gate 308 of the FGT 300, respectively corresponding to four possible memory states. In the example graph in FIG. 4, the threshold voltage window of a population of FGTs range from 0.5 volts (V) to 3.5 V. As a non-limiting example, seven possible memory states "0", "1", "2", "3", "4", "5", and "6" are defined or extend across the threshold voltage window, and respectively represent one erased states and six programmed states. More or fewer than seven memory states, such as a number based on a power-of two, may be possible for other configurations. The different states can be demarcated by partitioning the threshold voltage window into six regions of 0.5 V intervals. The FGT 300 may be in one of the states according to the charge stored in its floating gate 308 and where its drain-to-source current ID intersects a reference current $I_{REF}$. For example, a FGT programmed to store charge Q1 in memory state "1" since its curve 402 intersects the reference current $I_{REF}$ in a region of the threshold voltage region demarcated by the control gate voltage $V_{CG}$ in a range from 0.5 V to 1.0 V. The more memory states the FGT 300 is programmed to store, the more finely divided are the regions defining the threshold voltage window. In some examples configurations, the threshold voltage window may extend from −1.5 V to 5 V, providing a maximum width of 6.5 V. If the FGT 300 can be programmed into any one of sixteen possible states, each state may occupy a respective region spanning 200 millivolts (mV) to 300 mV. The higher the resolution of the threshold voltage window (i.e., more states into which the FGT 300 can be programmed), the higher the precision that is needed in programming and reading operations to successfully read and write data. Further description of memory states and threshold voltages is provided in further detail below with respect to programming, program verify, and read operations.

Referring to FIG. 5A, the memory cells 142 may be organized into an N-number of blocks, extending from a first block Block 1 to an Nth block Block N. Referring to FIG. 5B, for some example configurations, the N-number of blocks are organized into a plurality of planes. FIG. 5B shows an example configuration where the blocks are organized into two planes, including a first plane Plane 0 and a second plane Plane 1. Each plane is shown as included an M-number of blocks, extending from a first block Block 1 to an Mth block Block M. Data stored in different planes may be sensed simultaneously or independently.

For configurations where the memory cells are organized into a two-dimensional array, the memory cells may be configured in a matrix-like structure of rows and columns in each of the blocks. At the intersection of a row and a column is a memory cell. A column of memory cells is a referred to as a string, and memory cells in a string are electrically connected in series. A row of memory cells is referred to as a page. Where the memory cells are FGTs, control gates of FGTs in a page or row may be electrically connected together.

Additionally, each of the blocks includes word lines and bit lines connected to the memory cells. Each page of memory cells is coupled to a word line. Where the memory cells are FGTs, each word line may be coupled to the control gates of the FGTs in a page. In addition, each string of memory cells is coupled to a bit line. Further, a single string may span across multiple word lines, and the number of memory cells in a string may be equal to the number of pages in a block.

Figure 6:
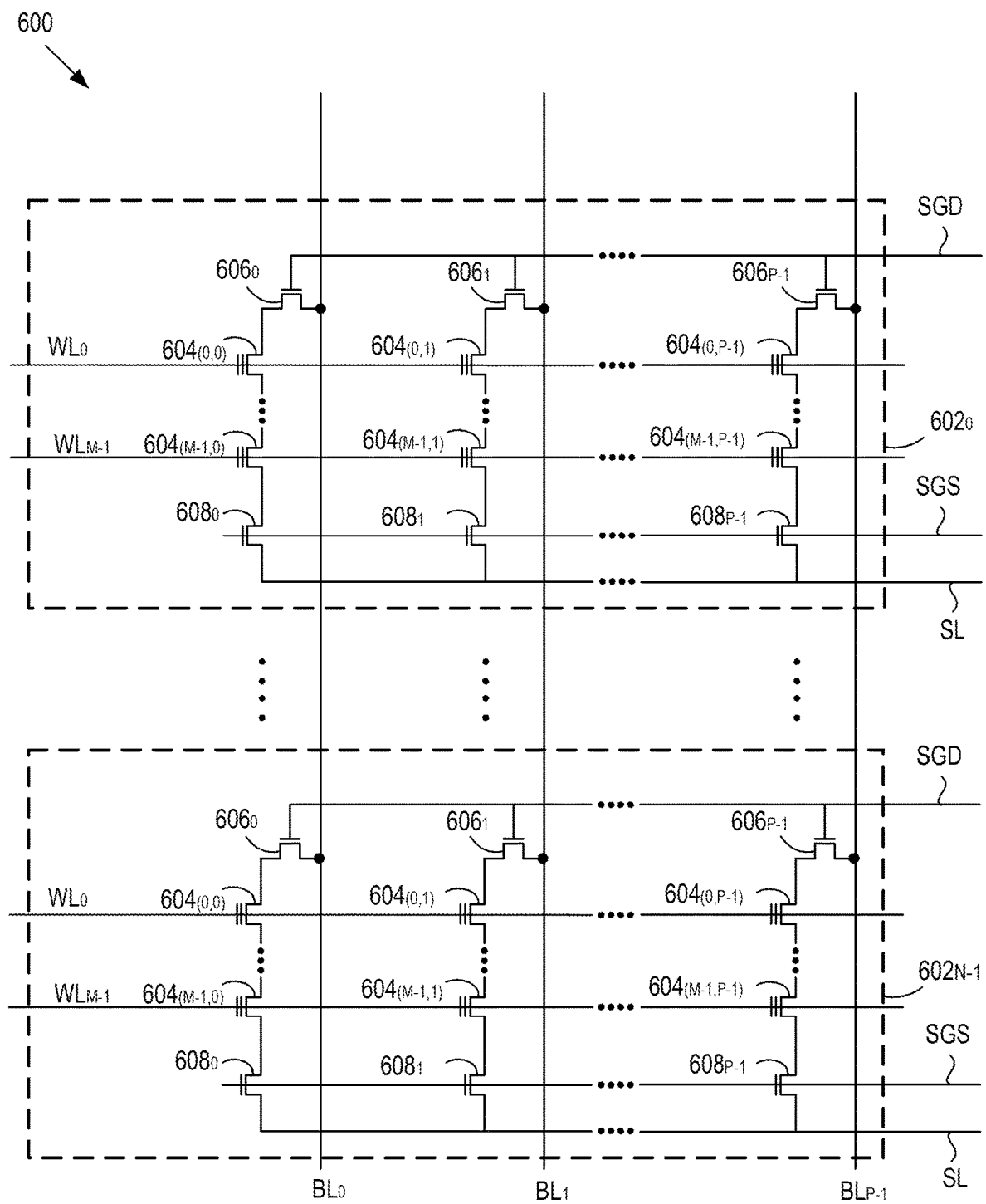
FIG. 6 is a circuit diagram of an example two-dimensional NAND-type flash memory array.

FIG. 6 is a circuit schematic diagram of at least a portion of an exemplary two-dimensional NAND-type flash memory array 600, which may be representative of at least a portion of the plurality of memory cells 142. For example, the memory array 600 may be representative of a single plane of blocks on a memory die 104. The memory array 600 may include an N-number of blocks $602_0$ to $602_{N-1}$. Each block 602 includes a P-number of strings of FGTs 604, with each string coupled to respective one of a P-number of bit lines $BL_0$ to $BL_{P-1}$. Additionally, each block 602 includes an M-number of pages of FGTs 604, with each page coupled to a respective one of an M-number of word lines $WL_0$ to $WL_{M-1}$. Each ith, jth FGT(i,j) of a given block 602 is connected to an ith word line $WL_i$ and to a jth bit line $BL_j$ of the given block. As shown in FIG. 6, bit lines $BL_0$ to $BL_{P-1}$ are shared among the blocks $602_0$ to $602_{N-1}$ may be which are shared among the blocks, such as blocks within the same plane.

Within each block 602, each string is connected at one end to an associated drain select gate transistor 606, and each string is coupled to its associated bit line BL via the associated drain select gate transistor 606. Switching of the drain select gate transistors $606_0$ to $606_{P-1}$ may be controlled using a drain select gate bias line SGD that supplies a drain select gate bias voltage $V_{SGD}$ to turn on and off the drain select transistors $606_0$ to $606_{P-1}$. In addition, within each block 602, each string is connected at its other end to an associated source select gate transistor 608, and each string is coupled to a common source line SL via the associated source select gate transistor 608. Switching of the source select gate transistors $608_0$ to $608_{P-1}$ may be controlled using a source select gate bias line SGS that supplies a source select gate bias voltage $V_{SGS}$ to turn on and off the source select transistors $608_0$ to $608_{P-1}$. Also, although not shown, in some cases, dummy word lines, which contain no user data, can also be used in the memory array 600 adjacent to the source select gate transistors $608_0$ to $608_{P-1}$. The dummy word lines may be used to shield edge word lines and FGTs from certain edge effects.

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 7:
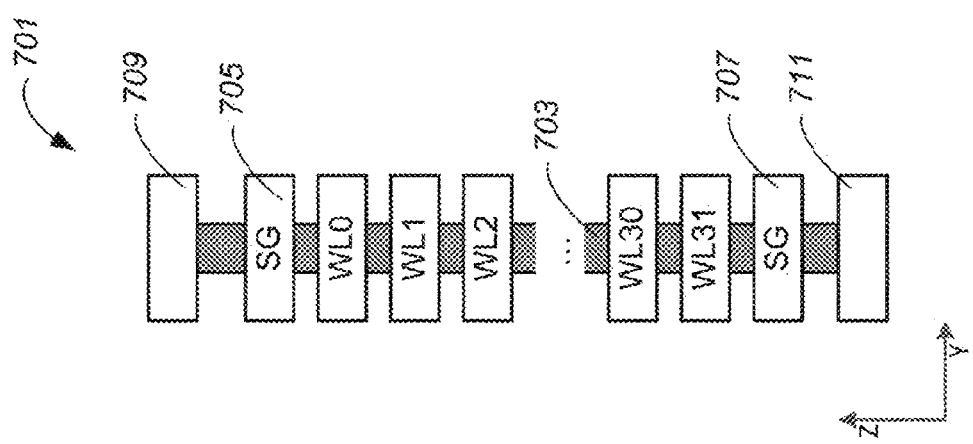
FIG. 7 is an example physical structure of a three-dimensional (3-D) NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with two-dimensional (planar) NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
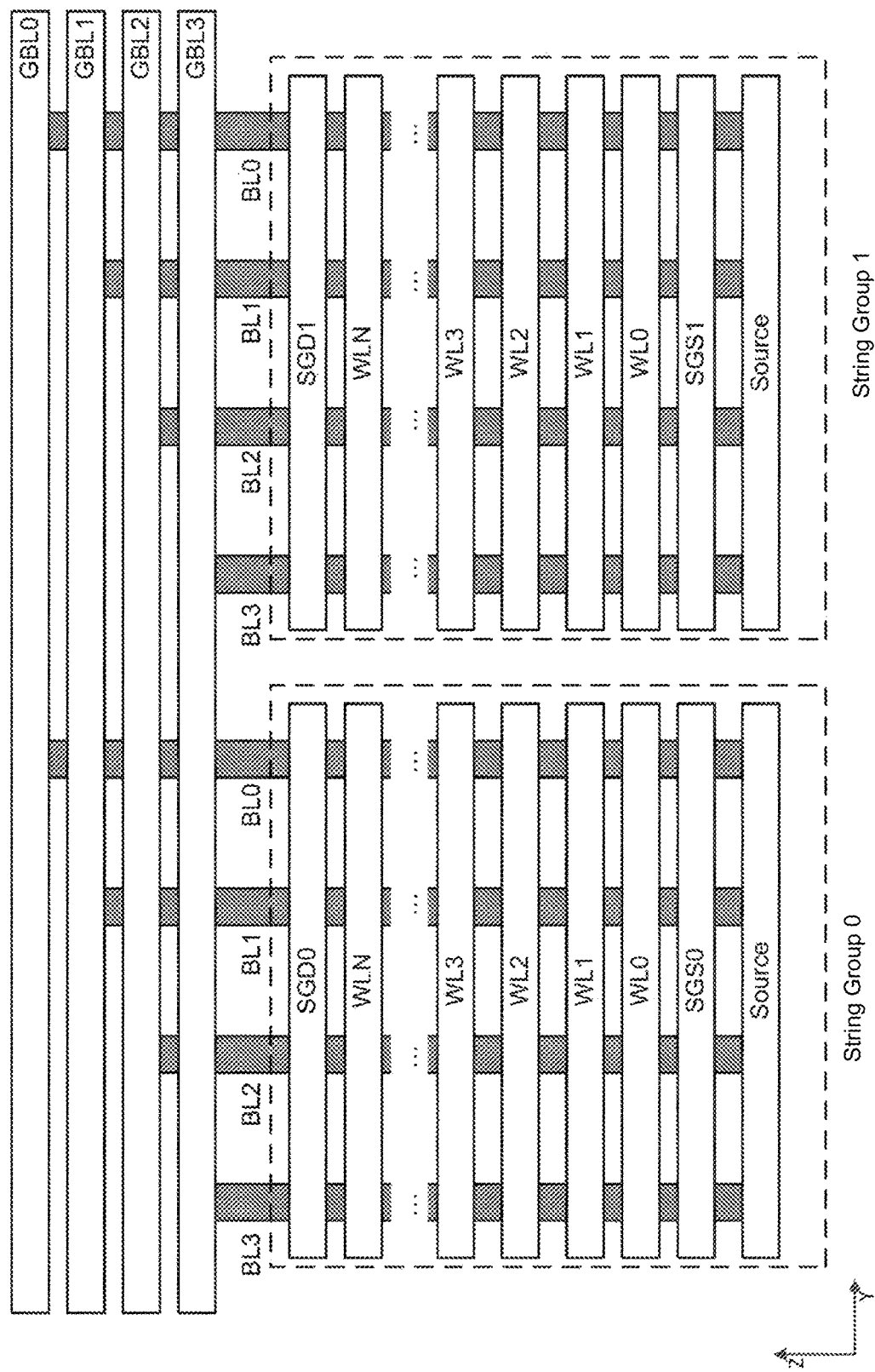
FIG. 8 is a cross-sectional view along the bit line direction (along the y-direction) of an example memory structure in which straight vertical NAND strings extend from common source connections in or near a substrate to global bit lines that extend over physical levels of memory cells.

FIG. 8 shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set or group of a plurality of NAND strings and may be designated as String Group 0, while NAND strings that are selected by source select line SGS1 and drain select line SGD1 may be considered as another set or group of a plurality of NAND strings and may be designated as String Group 1, as shown. A block may consist of any suitable number of such separately-selectable sets of string groups. It will be understood that FIG. 8 shows only portions of GBL0 GBL3, and that these bit lines extend further in the y-direction and may connect with additional NAND string groups in the block and in other blocks. Furthermore, additional bit lines extend parallel to GBL0 GBL3 (e.g. at different locations along x-axis, in front of, or behind the location of the cross-section of FIG. 10A).

Figure 9A:
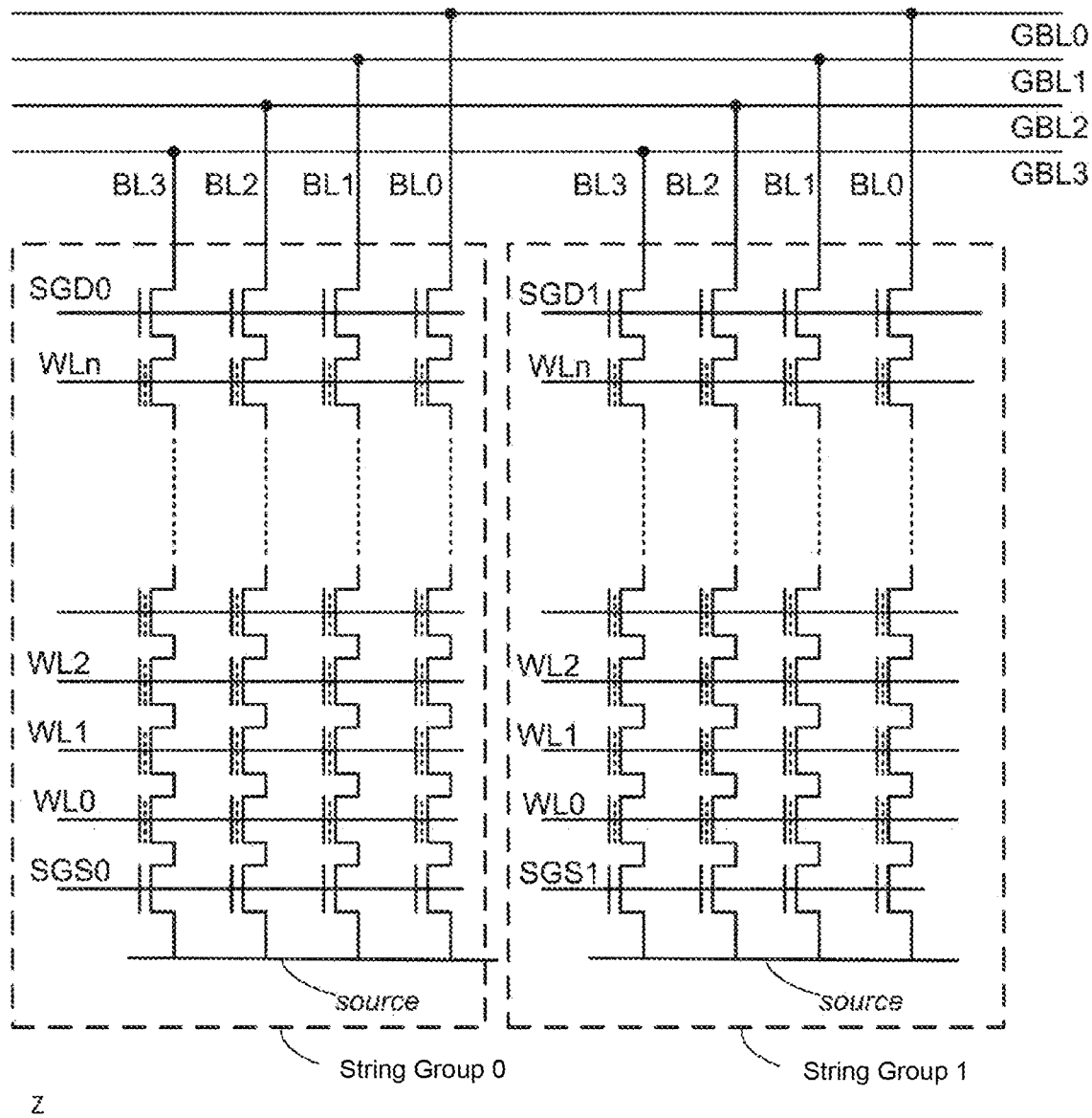
FIG. 9A is a circuit diagram of separately-selectable sets of NAND strings of FIG. 10A.

FIG. 9A illustrates separately-selectable NAND string groups of FIG. 8 schematically. It can be seen that each of the global bit lines (GBL0-GBL3) is connected to multiple separately selectable NAND string groups (e.g. GBL0 connects to vertical bit line BL0 of String Group 0 and also connects to vertical bit line BL0 of String Group 1) in the portion of the block shown. In some embodiments, word lines of all string groups of a block are electrically connected, e.g. WL0 of String Group 0 may be connected to WL0 of String Group 1, and to WL0 of String Group 2, etc. Such word lines may be formed as a continuous sheet of conductive material that extends through all sets of strings groups of the block. Source lines may also be common for all string groups of a block. For example, a portion of a substrate may be doped to form a continuous conductor underlying a block. Source and drain select lines are not shared by different string groups so that, for example, SGD0 and SGS0 can be biased to select String Group 0 without similarly biasing SGD1 and SGS1 to select String Group 1. Thus, String Group 0 may be individually selected (connected to global bit lines and a common source) while String Group 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected string group may be accessed (e.g. a read voltage is applied to the particular word line, while read-pass voltages are applied to other word lines). Erasing operations may be applied on an entire block (all sets of strings in a block) rather than on a particular set of strings in a block.

Figure 9B:
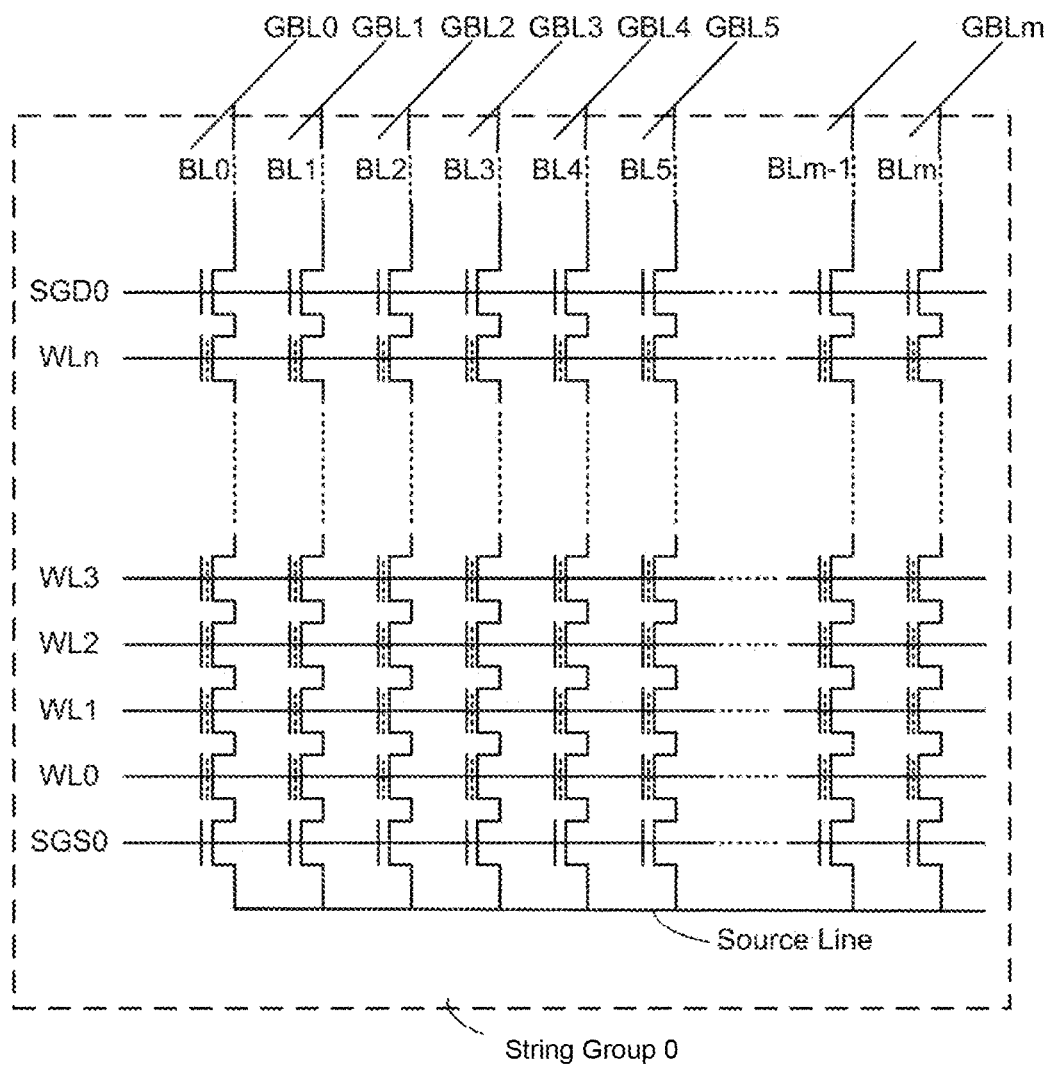
FIG. 9B is a circuit diagram of a separately selectable set of NAND strings in cross section along the x-z plane.

FIG. 9B shows a separately selectable set of NAND strings of String Group 0 of FIGS. 8 and 9A in cross section along the X-Z plane. It can be seen that each global bit line (GBL0-GBLm) is connected to one vertical NAND string (vertical bit line BL0-BLm) in String Group 0. String Group 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String Group 0 is selected.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming a page of memory cells in parallel.

The memory die 104 may also include a row address decoder 148 and a column address decoder 150. The row address decoder 148 may decode a row address and select a particular word line in the memory array 142 when reading or writing data to/from the memory cells 142. The column address decoder 150 may decode a column address to select a particular group of bitlines in the memory array 142 to read/write circuits 144.

In addition, the non-volatile memory die 104 may include peripheral circuitry 152. The peripheral circuitry 152 may include control logic circuitry 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including voltages (including program voltage pulses) to the word lines, erase voltages (including erase voltage pulses), the source select gate bias voltage $V_{SSG}$ to the source select gate bias line SSG, the drain select gate bias voltage $V_{DSG}$ to the drain select gate bias line DSG, a cell source voltage $V_{celsrc}$ on the source lines SL, as well as other voltages that may be supplied to the memory array 142, the read/write circuits 144, including the sense blocks 146, and/or other circuit components on the memory die 104. The various voltages that are supplied by the power control circuitry 160 are described in further detail below. The power control circuitry 160 may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations.

In order to program a target memory cell, and in particular a FGT, the power control circuitry 160 applies a program voltage to the control gate of the memory cell, and the bit line that is connected to the target memory cell is grounded, which in turn causes electrons from the channel to be injected into the floating gate. During a program operation, the bit line that is connected to the target memory cell is referred to as a selected bit line. Conversely, a bit line that is not connected to a target memory cell during a program operation is referred to as an unselected bit line. In this context, a state of the bit line may refer to whether the bit line is selected or unselected. Otherwise stated, a bit line can be in one of two states, selected or unselected. When electrons accumulate in the floating gate, the floating gate becomes negatively charged and the threshold voltage $V_{TH}$ of the memory cell is raised. The power control circuitry 160 applies the program voltage $V_{PGM}$ on the word line that is connected to the target memory cell in order for the control gate of the target memory cell to receive the program voltage $V_{PGM}$ and for the memory cell to be programmed. As previously described, in a block, one memory cell in each of the NAND strings share the same word line. During a program operation, the word line that is connected to a target memory cell is referred to as a selected word line. Conversely, a word line that is not connected to a target memory cell during a program operation is referred to as an unselected word line.

Figures 10A, 10B, 10C:
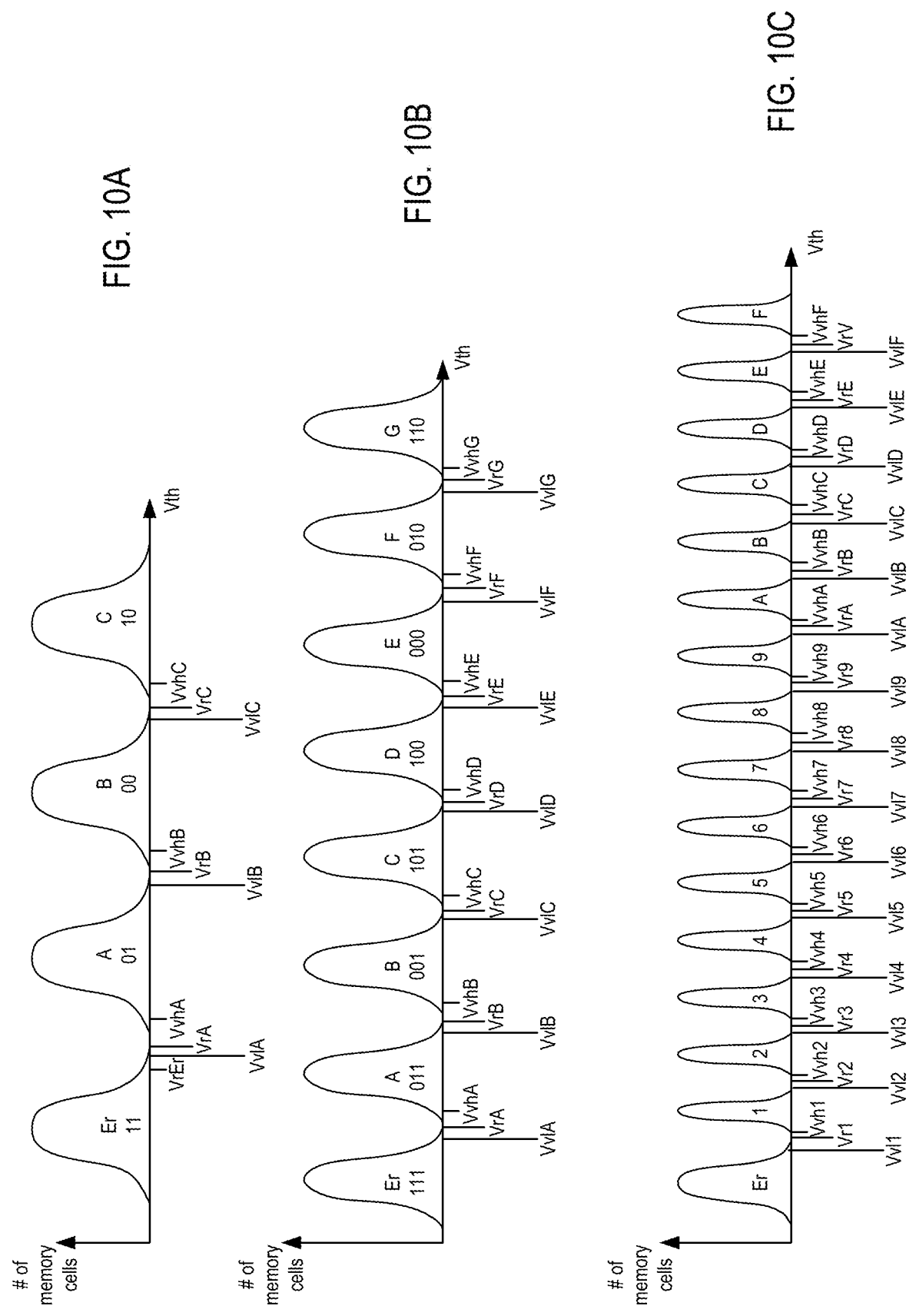

FIGS. 10A-10C are plots of threshold voltage distribution curves for different numbers of bits being stored the memory cells. The threshold voltage distribution curves are plotted for threshold voltage $V_{TH}$ as a function of the number of memory cells. FIG. 10A show threshold voltage distribution curves for memory cells programmed to store two bits of data, FIG. 10B show threshold voltage distribution curves for memory cells programmed to store three bits of data, and FIG. 10C show voltage distribution curves for memory cells programmed to store four bits of data. Similar threshold voltage distribution curves may be generated for memory cells programmed to store numbers of bits other than two, three, and four.

At a given point in time, each memory cell may be a particular one of a plurality of memory states (otherwise referred to as a data state). The memory states may include an erased stated and a plurality of programmed states. Accordingly, at a given point in time, each memory cell may be in the erased state or one of the plurality of programmed states. The number of programmed states corresponds to the number of bits the memory cells are programmed to store. With reference to FIG. 10A, for a memory cell programmed to store two bits, the memory cell may be in an erased state Er or one of three programmed states A, B, C. With reference to FIG. 10B, for a memory cell programmed to store three bits, the memory cell may be in an erased state Er or one of seven programmed states A, B, C, D, E, F, G. With reference to FIG. 10C, for a memory cell programmed to store four bits, the memory cell may be in an erased state Er or one of fifteen programmed states 1, 2, 3, 4, 5, 6, 7, 8, 9, A, B, C, D, E, F. As shown in FIGS. 10A-10C, each voltage distribution curve is associated with the erased state or one of the programmed states.

Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage $V_{TH}$ a memory cell has allows the data (i.e., the logic values of the bits) that the memory cell is storing to be determined. The specific relationship between the data programmed into the memory cells and the threshold voltage levels of the memory cell depends on the data encoding scheme used for programming the memory cells. In one example, as shown in FIGS. 10A and 10B, a Gray code scheme is used to assign data values to the threshold voltage distribution curves. Under this scheme, for memory cells programmed with two bits of data, the data value "11" is assigned to the range of threshold voltages associated with the erased state Er, the data value "01" is assigned to the range of threshold voltages associated with programmed state A, the data value "00" is assigned to the range of threshold voltages associated with programmed state B, and the data value "10" is assigned to the range of threshold voltages associated with the programmed state C. Similar relationships between data values and memory states can be made for memory cells programmed to store three bits, four bits, or other bits of data.

Prior to performance of a program operation that programs a plurality or group of target memory cells, all of the memory cells of the group subjected to and/or selected to be programmed in the programming operation may be in the erased state. During the programming operation, the power control circuitry 160 may apply the program voltage to a selected word line and in turn the control gates of the target memory cells as a series of program voltage pulses. The target memory cells being programmed concurrently are connected to the same, selected word line. In many programming operations, the power control circuitry 160 increases the magnitude of the program pulses with each successive pulse by a predetermined step size. Also, as described in further detail below, the power control circuitry 160 may apply one or more verify pulses to the control gate of the target memory cell in between program pulses as part of a program loop or a program-verify operation. Additionally, during a programming operation, the power control circuitry 160 may apply one or more boosting voltages to the unselected word lines.

The target memory cells connected to the selected word line will concurrently have their threshold voltage change, unless they have been locked out from programming. When the programming operation is complete for one of the target memory cells, the target memory cell is locked out from further programming while the programming operation continues for the other target memory cells in subsequent program loops. Also, for some example programming operations, the control logic circuitry 154 may maintain a counter that counts the program pulses.

During a program operation to program a group of target memory cells, each target memory cell is assigned to one of the plurality of memory states according to write data that is to be programmed into the target memory cells during the program operation. Based on its assigned memory state, a given target memory cell will either remain the erased state or be programmed to a programmed state different from the erased state. When the control logic 154 receives a program command from the controller 102, or otherwise determines to perform a program operation, the write data is stored in latches included in the read/write circuitry 144. During the programming operation, the read/write circuitry 144 can read the write data to determine the respective memory state to which each of the target memory cells is to be programmed.

One or more verify voltage levels may be used to verify programming of the cells. In one implementation, two voltage verify levels are used in which each programmed state is associated with two respective verify voltage levels Vvl and Vvh, with Vvl being a lower voltage than Vvh, as illustrated in FIGS. 10A-10C. For example, FIG. 10A shows VvlA (lower verify voltage for state A) and VvhA (higher verify voltage for state A). Specifically, in the process of verifying the voltage levels, the two respective verify voltage levels may be used to verify the programming of a respective state. In practice, during a verify time period of a verify operation to verify that selected memory cells are properly programmed, the selected memory cells may first be verified with respect to the lower verify voltage (Vvl) during a first portion of the verify operation (discussed below as a low verification portion VL-sense), and thereafter verified with respect to the higher verify voltage (Vvh) during a second portion of the verify operation (discussed below as a high verification portion VH-sense). In this way, using the two verify voltage levels may reduce the possibility of over-programming the target memory cell.

Thus, a given target memory cell is programmed in its assigned memory state when its threshold voltage $V_{TH}$ is above the verify voltage Vvh associated with the memory state assigned to that target memory cell. As long as the threshold voltage $V_{TH}$ of the given target memory cell is below the associated verify voltage Vvh (such as at the verify voltage Vvl), the control gate of the target memory cell may be subject to a program pulse to increase the target memory cell's threshold voltage $V_{TH}$ to within the threshold voltage range associated with the memory state assigned to the given target memory cell. Alternatively, when the threshold voltage $V_{TH}$ of the given target memory cell increases to above the associated verify voltage level Vvh, then programming may be complete for the given target memory cell. As described in further detail below, a sense block 146 may participate in a program-verify operation that determines whether programming for a given memory cell is complete.

As previously mentioned, target memory cells subject to a program operation may also be subject to a verify operation that determines when programming is complete for each of the target memory cells. The verify operation is done in between program pulses, and so the programming operation and the verify operation in performed in an alternating or looped manner. The combination of the programming operation and the verify operation is called a program-verify operation. Accordingly, a program-verify operation includes a plurality of programming operations and a plurality of verify operations that are alternatingly performed. That is, a program-verify operation involves a programming operation followed by a verify operation, followed by another programming operation, followed by another verify operation, and so on until the program-verify operation has no more programming or verify operations to be performed. In addition, a single programming operation of a program-verify operation includes the power control circuitry 160 supplying one or more program pulses to the selected word line for that single programming operation, and a single verify operation of a program-verify operation includes the power control circuitry 160 supplying one or more verify pulses to the selected word line for that single programming operation. Accordingly, a program-verify operation may include the power control circuitry 160 supplying a pulse train or a series of voltage pulses to the selected word line, where the pulse train includes one or more program pulses followed by one or more verify pulses, followed by one or more program pulses, followed by one or more verify pulses, and so on until the program-verify process has no more program or verify pulses for the power control circuitry 160 supply to the selected word line.

A program-verify operation is complete when the verify portion of the program-verify operation identifies that all of the memory cells have been programmed to their assigned threshold voltages $V_{TH}$. As mentioned, the verify process verifies or determines that a given target memory cell is finished being programmed when the verify process determines that the target memory cell's threshold voltage has increased to above the verify voltage level Vvh associated with the memory state to which the target cell is to be programmed.

As described in further detail below, sense amplifier circuits included in one or more sense blocks 146 simultaneously operate to perform a sense operation to verify that target memory cells subject to the sense operation are sufficiently programmed into their assigned memory state. For some example program-verify operations, all of the target memory cells subject to a program-verify operation are not subject to a single sense operation at the same time. Alternatively, for a single sense operation, only those target memory cells that are assigned to the same memory state are subject to a sense operation. For a single sense operation, target memory cells that are subject to the single sense operation are called selected memory cells or selected target memory cells, and target memory cells that are not subject to the single sense operation are called unselected memory cells or unselected target memory cells. Likewise, for a group of bit lines connected to the target memory cells of a program-verify operation, bit lines connected to the selected memory cells for a single sense operation are called selected bit lines, and bit lines connected to the unselected memory cells for a single sense operation are called unselected bit lines.

Also, when programming target memory cells into assigned states, for a given subset of the target memory cells to be programmed into the same memory state, some of those target memory cells of the subset reach the assigned memory state before other target memory cells of the subset. To save current consumption, for a sense operation to verify a subset of memory cells programmed into a given assigned memory state, those memory cells of the subset that already reached the assigned memory state are locked out from being subjected to the sense operation. A locked out memory cell, like an unselected memory cell, is biased so that it does not draw current. Effectively, for a given sense operation, locked out memory cells become unselected memory cells. Accordingly, during a given sense operation, locked out memory cells are interchangeably referred to as unselected memory cells, bit lines coupled to locked out memory cells are interchangeably referred to as lockout (or locked out) bit lines or unselected bit lines. Also, selected bit lines during a sense operation are interchangeably referred to as non-lockout (or non-locked out) bit lines.

In addition, as described in further detail below, sense amplifier circuits are configured to bias bit lines differently to be selected bit lines or unselected (or non-lockout) bit lines. A sense amplifier circuit configured to bias a bit line to be a selected bit line is referred to as a selected sense amplifier circuit, a non-lockout sense amplifier circuit, or a non-locked out sense amplifier circuit. Also, as described in further detail below, a selected sense amplifier circuit configured to bias a bit line to be a selected bit line is referred to as being and/or operating in a selected mode, a non-lockout mode, or a non-locked out mode. Additionally, a sense amplifier circuit configured to bias a bit line to be an unselected bit line is referred to as an unselected sense amplifier circuit, a lockout sense amplifier circuit, or a locked out sense amplifier circuit. Also, as described I further detail below, a selected sense amplifier circuit to bias a bit line to be an unselected bit line is referred to as being and/or operating in an unselected mode, a lockout mode, or a locked out mode.

Additionally, as described, when verifying a subset of the target memory cells assigned to the same memory state, during a verify time period of a verify operation to verify that the target memory cell is properly programmed, the target memory cell may first be verified with respect to the lower verify voltage (Vvl) during a first portion of the verify operation (discussed below as a low verification portion VL-sense), and thereafter verified with respect to the higher verify voltage (Vvh) during a second portion of the verify operation (discussed below as a high verification portion VH-sense). Accordingly, during a verification operation to verify whether certain selected memory cells are properly programmed in the assigned memory state, two sense operations are performed, a first sense operation to verify the selected memory cells with respect to the lower verify voltage, and a second sense operation to verify the selected memory cells with respect to the higher verify voltage.

For each of the verify operations, the power control circuitry 160, or some combination of the power control circuitry 160, the read/write circuitry 144, and the sense blocks 146, may supply voltages at appropriate levels to the selected and unselected word lines and the selected and unselected bit lines in order for a verify operation to be performed for the selected memory cells of the target memory cells subject to the program-verify operation. For clarity, and unless otherwise specified, the combination of the power control circuitry 160, the read/write circuitry 144, and the sense blocks 146 used to bias the selected and unselected word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof.

For performance of a verify operation in a block, the voltage supply circuitry may supply a drain select gate bias voltage $V_{SGD}$ on the drain select gate bias line SGD to the control gates of the drain select gate transistors (such as those shown in FIGS. 6-10C) and a source select gate bias voltage $V_{SGS}$ on the source select gate bias line SGS to the control gates of the drain select gate transistors (such as those shown in FIGS. 6-10C) at levels that turn on the drain select gate transistors and the source select gate transistors in response to the voltage supply circuitry supplying voltages at suitable levels on the common source line SL and to the bit lines.

Additionally, the voltage supply circuitry supplies a source line voltage at a cell source voltage level Vcelsrc, otherwise referred to as the cell source voltage Vcelsrc, on the common source line SL. Further, the voltage supply circuitry biases the drain side of the selected bit lines with a high supply voltage VHSA that is higher in magnitude than the cell source voltage Vcelsrc. The difference between the high supply voltage VHSA and the cell source voltage level Vcelsrc may be great enough to allow current to flow from the drain side to the source side of a string that includes a selected target memory cell in the event that the selected target memory cell has a threshold voltage $V_{TH}$ that allows it to conduct a current. During a verify operation, a selected memory cell can be generally characterized as fully conducting, marginally conducting, or non-conducting, depending on the threshold voltage $V_{TH}$ of the selected memory cell. Also, the voltage supply circuitry biases the drain side of the unselected bit lines to the cell source voltage Vcelsrc. By biasing the drain side and the source side of unselected bit lines to the cell source voltage Vcelsrc, the voltage difference between the drain side and source side voltages will not allow current to flow through the NAND string connected to the unselected bit line. Further, the voltage supply circuitry biases the unselected word lines, and in turn the control gates of FGTs coupled to the unselected word lines, to a read voltage Vread. The read voltage is high enough to cause the FGTs coupled to unselected word lines to conduct a current regardless of its threshold voltage $V_{TH}$. In addition, the voltage supply circuitry biases the selected word line with a control gate reference voltage $V_{CGRV}$, which may be in the form of one or more verify pulses as previously described. The control gate reference voltage $V_{CGRV}$ may be different for verification of target memory cells of different memory states. For example, the voltage supply circuitry may supply a different control gate reference voltage $V_{CGRV}$ (or a control gate reference voltage $V_{CGRV}$ at different level) when verifying target memory cells programmed to state A than when verifying target memory cells programmed to state B, and so on.

Once the voltage supply circuitry supplies the voltages to the selected and unselected word lines and bit lines, and to the drain select gate transistors, source select gate transistors, drain select gate bias line SGD, and source select gate bias line SGS, a sense block can perform a sense operation that identifies whether a selected target memory cell is conducting, and in turn sufficiently programmed. Further details of the sense operation portion of the verify operation are described in further detail below.

As previously described, the threshold voltage $V_{TH}$ of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks 146 may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage $V_{TH}$ of the target memory cells. For some configurations, the level of the voltage supplied to the selected word lines may vary depending on the states of the memory cells.

The voltage supply circuitry may also bias the bit lines so that the high supply voltage VHSA is applied to the drain side of the bit lines and the cell source voltage Vcelsrc is applied to the source side of the bit lines to allow for the current flow, provided that the threshold voltage $V_{TH}$ of the selected memory cell allows for it. For some example read configurations, the sense block 146 can perform a sense operation for fewer than all of the memory cells of a page. For such configurations, the target memory cells of the page that are subject to and/or that are selected for a given sense operation are referred to as selected memory cells or selected target memory cells. Conversely, the target memory cells of the page that are not subject to and/or that are not selected for the sense operation are referred to as unselected memory cells. Accordingly, bit lines connected to selected target memory cells are referred to as selected bit lines, and bit lines connected to unselected target memory cells are referred to as unselected bit lines. In this context, a state of the bit line may refer to whether the bit line is selected or unselected. Otherwise stated, a bit line can be in one of two states, selected or unselected. The voltage supply circuitry can supply the voltages to the selected and unselected word lines and the selected and unselected bit lines at levels in various combinations, in various sequences, and/or over various sense operations in order determine the threshold voltages of the target memory cells so that the data values of the data that the target memory cells are storing can be determined.

Embodiments described below include sense amplifier circuits configured to reduce and/or minimize noise generated on selected bit lines during a sense operation, such as a sense operation performed as part of a verification process of a programming or program-verify operation. During a sense operation to determine a status of target memory cells, such as those coupled to a selected word line and a plurality of bit lines of a memory block, selected sense amplifier circuits are connected to selected bit lines, which in turn are connected to selected memory cells of the target memory cells, and unselected sense amplifier circuits are connected to unselected bit lines, which in turn are connected to unselected memory cells of the target memory cells. Selected sense amplifier circuits are connected to selected bit lines and unselected sense amplifier circuits are connected to unselected bit lines by way of their respective bit line connection circuits, as described in further detail below.

A given sense amplifier circuit, whether selected or unselected for a given sense operation, includes a sense node (SEN) and sense node charge circuitry connected to the sense node (SEN). During a sense operation, the sense node charge circuitry is configured to charge the sense node (SEN) by accumulating charge on the sense node (SEN) in response to receipt of a pulse, such as a voltage pulse. The pulse may be a single pulse or one of a plurality of pulses of a pulse signal, otherwise referred to as a clock signal (CLKSA). By charging the sense node (SEN), the sense node charge circuitry (such as a sense capacitor as described in further detail below) generates a voltage at a predetermined clock level corresponding to the amount of charge accumulated on the sense node (SEN). The sense node charge circuitry may itself be charged in response to receipt of the voltage pulse, and generate the voltage at the predetermined clock level in response to being charged. In general, the sense node charge circuitry charging the sense node (SEN) in response to receipt of a voltage pulse and the sense node circuitry charging in response to receipt of the voltage pulse are used interchangeably to mean the same.

In addition, a given sense amplifier, whether selected or unselected for a given sense amplifier, includes a communication node (COM). As used herein, a communication node is a node in a sense amplifier circuit through which current passes before being drawn through a selected bit line during a sense operation to determine a status of a selected memory cell coupled to the selected bit line. In at least some example configurations, the communication node (COM) is a node of the given sense amplifier circuit that a bit line biasing circuit of the sense amplifier circuit uses to set a bit line bias voltage of the bit line to a certain level. For example, the bit line biasing circuit may be connected to a bit line bias node where the bit line biasing circuitry sets the bit line bias voltage by way of a path that includes the communication node (COM). The path may further include a bit line connection circuit, as described in further detail below.

The given sense amplifier further includes a sense enable circuit, which may include at least one transistor, configured or disposed between the sense node (SEN) and the communication node (COM). The sense enable circuit is configured to be enabled (or in an enabled state) and disabled (or in an enabled state). Where the sense enable circuit includes a transistor, the sense enable circuit is enabled when the transistor is turned on, and is disabled when the transistor is turned off. In particular example configurations, the sense enable circuit includes an n-channel metal-oxide-semiconductor transistor (NMOS transistor) that is configured to turn on and turn off in response to receipt of a voltage received at its gate terminal. When enabled, the sense enable circuit is configured as a charge-sharing circuit in that it forms a charge-sharing relationship between the sense node (SEN) and the communication node (COM). When disabled, the sense enable circuit is configured as isolation circuitry that isolates the sense node (SEN) from the communication node (COM). In addition or alternatively, the sense enable circuit is configured as a pass transistor that is configured to pass charge from the sense node (SEN) to the communication node (COM). In general, a pass transistor is configured to form a conductive path between two of its terminals when turned on. Accordingly, as a pass transistor, the sense enable circuit may form a conductive path between two of its terminals when it turns on, and allow current to flow through the conductive path. One of the terminals is connected to the sense node (SEN) and the other terminal is connected to the communication node (COM). In particular example configurations, the pass transistor is an NMOS transistor where the two terminals forming the conductive path are the drain and source terminals, and the NMOS transistor further includes a gate terminal configured to receive a sense enable control signal that turns on and off the pass transistor.

Herein, two nodes (e.g., the sense node (SEN) and the communication node (COM)) form a charge-sharing relationship when the two nodes are able to share charge they have respectively accumulated prior. A charge-sharing relationship may form when a transistor disposed between the two nodes turns on, such as by being biased with a gate-to-source voltage at a voltage level above its threshold voltage, thereby creating a drain-to-source conductive path having a relatively low resistance that allows the accumulated charge to flow between the drain and source terminals, and thus between the two nodes subject to the charge-sharing relationship.

Also herein, two nodes (e.g., the sense node (SEN) and the communication node (COM)) are isolated from each other when they are not forming a charge-sharing relationship. When isolated from each other, movement of accumulated charge in the form of current, from one node to the other, is prevented or inhibited, where such movement of charge from one node to the other would otherwise occur if the two nodes were forming a charge-sharing relationship. In addition, a transistor configured or disposed between the two nodes isolates the two nodes from each other by being turned off, such as in response to a gate-to-source voltage below threshold voltage of the transistor, thereby creating a drain-to-source path having a substantially high resistance that effectively creates an open circuit between the two nodes to prevent or inhibit the flow of current between the two nodes.

In general, a given sense amplifier circuit includes circuitry, including a bit line connection circuit and a sense enable circuit, that is configured to connect the sense node charge circuitry and/or the sense node (SEN) to a bit line. When the circuitry connects the sense node charge circuitry to the bit line, a path may form that allows current to flow from the sense node charge circuitry (or the sense node (SEN)) to the bit line. As described in further detail below, to reduce the affect of noise generated in unselected sense amplifier circuits on selected bit lines, in one example implementation, the sense enable circuit in an unselected sense amplifier circuit connected to an unselected bit line is disabled during time periods of a sense operation when the sense enable circuit of a selected sense amplifier circuit is enabled such that during the time periods, the circuitry of the unselected sense amplifier circuit isolates its sense node charge circuitry from the unselected bit line. In another example implementation, during the time periods, the sense enable circuit in the unselected sense amplifier circuit is also enabled such that the circuitry connects the sense node charge circuitry to the unselected bit line. For this implementation, a drain circuit is configured to drain charge from the sense node charge circuitry so that the sense enable circuit, despite being enabled, does not transmit charge to generate noise at the communication node (COM).

During a sense operation, the sense node charge circuitry charges the sense node (SEN) while the sense enable circuit is disabled and isolates the sense node (SEN) from the communication node (COM). This allows the sense voltage to increase as charge accumulates on the sense node (SEN) since the charge has nowhere to move.

In a selected sense amplifier circuit, upon charging the sense node (SEN) with the sense node charge circuitry, the sense enable circuit changes from being disabled to being enabled, thereby changing its configuration from an isolation circuit to a charge-sharing circuit. As described in further detail below, a sense circuit controller controls the timing of when the sense enable circuit changes from being disabled to enabled through output of a sense enable control signal. When enabled and forming the charge-sharing relationship, the sense enable circuit allows the accumulated charge on the sense node (SEN) to flow through it to the communication node (COM) in the form of current. Also in the selected sense amplifier circuit, the bit line biasing circuit may bias the selected bit line to which it is connected in a way that will allow the target memory cell to draw the current passing through the enabled sense enable circuit to the communication node (COM), depending on a status of the selected memory cell coupled to the selected bit line. That is, the amount of current that the selected memory cell draws when the sense enable circuit is enabled may indicate the status of the memory cell, which the sense amplifier circuit senses as part of the sense operation.

An unselected sense amplifier circuit connected to an unselected bit line may bias the unselected bit line in a way that prevents the unselected bit line from drawing current. Even so, to minimize the control complexities of the sense circuit controller, the sense circuit controller may output the same sense enable control signal to the all of the sense amplifier circuits, selected and unselected, connected to selected and unselected bit lines, and may output the same voltage pulse of the clock signal (CLKSA) to all of the clock nodes of the sense amplifier circuits, selected and unselected. In turn, the unselected sense amplifier circuits are accumulating charge on their respective sense nodes (SEN), and the sense enable circuits are forming charge sharing relationships between the sense nodes (SEN) and the communication nodes (COM) in the unselected sense amplifier circuits. Despite the unselected sense amplifier circuit being connected to an unselected bit line, the enabling of the sense enable circuit in combination with the charge accumulated on the sense node (SEN) may allow the sense enable circuit to communicate charge from the sense node (SEN) to the communication node (COM), which in turn causes a communication voltage on the communication node (COM) to increase. Since the sense circuit controller does need current to flow to the communication node (COM) in unselected sense amplifier circuits, the communication of the current to the communication node (COM) is noise, manifested by the increase in communication voltage on the communication node (COM).

In general, noise is an unwanted disturbance in an electrical signal. In unselected sense amplifier circuits, charge that an enabled sense enable circuit communicates from the sense node (SEN) to the communication node (COM) and an increase in voltage on the communication node (COM) are forms of noise in unselected sense amplifier circuits. As described in further detail below with reference to FIG. 11C, noise present in unselected sense circuits can find its way to selected bit lines by way of unselected bit lines and coupling capacitance between the selected and adjacent unselected bit lines. The sense circuit controller may be configured with built in delay to allow the noise to dissipate in order to avoid sensing errors due to the noise. Accordingly, minimizing the noise generated on the communication nodes in unselected sense amplifier circuits could speed up the sense operations.

Example sense amplifier circuits described with reference to FIGS. 12A-12D include or are in communication with sense node isolation control circuitry configured to control the sense enable circuit, as an isolation circuit, in order isolate the sense node (SEN) from the communication node (COM), where the control is dependent on the connection of the sense amplifier circuit to an unselected bit line. That is, at certain time periods during a sense operation, the sense enable circuits in both selected sense amplifier circuits and unselected sense amplifier circuits are disabled to isolate the sense nodes (SEN) from the communication nodes (COM), such as before the sense node charge circuitry charges up the sense nodes (SEN). During these time periods, in an unselected sense amplifier circuit, the sense node isolation control circuitry's control of the sense enable circuit may not be considered dependent on the unselected sense amplifier's connection to the unselected bit line in view of the sense enable circuits being disabled in both the selected and the unselected sense amplifier circuits. However, in other time period of the sense operation, such as following the sense node charge circuitry's charging of the sense nodes, sense node isolation control circuits in selected sense amplifier circuits enable the sense enable circuits of the selected sense amplifier circuits, while sense node isolation control circuits in unselected sense amplifier circuits disable the sense enable circuits of the unselected sense amplifier circuits. During these other time periods, the sense node isolation control circuits' control of the sense enable circuits in the unselected sense amplifier circuits is dependent on the unselected sense amplifier circuits' connections to the unselected bit lines in that but for the dependency, the sense enable circuits would be enabled and allow for a charge-sharing relationship between the sense nodes (SEN) and the communication nodes (COM) in the unselected sense amplifier circuits.

In some example configurations, the sense node isolation control circuitry's control of the sense enable circuits is dependent on the connection of the sense amplifier's connection to the unselected bit line in that its control is based on or response to receipt of a state-dependent control signal. Herein, the term state-dependent refers to an attribute of a signal, such as a voltage level of a voltage, being dependent on whether the bit line to which the sense amplifier circuit is connected is a selected (or non-locked out) bit line or an unselected (or locked out) bit line, and/or whether the sense amplifier circuit receiving the signal is a selected or non-lockout sense amplifier circuit configured in a selected or non-lockout mode, or is an unselected amplifier circuit configured in an unselected or lockout mode. The sense node isolation control circuitry is configured to control the sense enable circuit by disabling or turning off the sense enable circuit in order to isolate the sense node (SEN) from the communication node (COM). The sense node isolation control circuitry's control of the sense enable circuitry is dependent on the state-dependent control signal indicating that the bit line is an unselected bit line. In some example configurations, the state-dependent control signal may be considered or referred to as a lockout signal indicative of locking out the sense amplifier circuit during at least a portion of a programming operation.

Example sense circuits described with reference to FIGS. 13A, 13B include or are in communication with sense node drain circuitry configured to drain charge at the sense node (SEN) dependent on the sense node charge circuitry charging the sense node (SEN) and the sense amplifier circuit's connected to the unselected bit line. The sense node drain circuitry is configured to drain at least part of the charge stored or accumulated at the sense node (SEN). In one implementation the drain circuit is configured to create a path for current flow from the sense node (SEN) to a different node or location in the unselected sense amplifier circuit, thereby draining at least some of the charge accumulated on the sense node (SEN). An example of a different node or location is a ground reference points, such as a source ground SRCGND described in further detail below, or other location or lower voltage potential than the sense node (SEN). In this way, the sense node drain circuitry operates as a path for charge from the sense node (SEN) to the different node. As described in further detail below with reference to FIG. 13B, the sense node drain circuitry drains charge from the sense node (SEN) by creating an electrical path to source ground SRCGND. Specifically, because the sense node (SEN) is at a higher voltage potential to source ground (SRCGND), charge at the sense node (SEN) flows to the lower potential of the source ground (SRCGND).

The sense node drain circuitry's configuration to drain the charge at the sense node is dependent on the sense node charge circuitry charging the sense node (SEN) in that the charge that the sense node drain circuit drains is the charge that the sense node charge circuitry supplied or pumped to the sense node (SEN). Additionally, the sense node drain circuitry's configuration to drain the charge at the sense node is dependent on the sense amplifier's connection to the unselected bit line in that if the sense amplifier circuit were alternatively connected to a selected bit line, the sense node drain circuitry would not be configured to drain the charge.

For these embodiments, the sense enable circuits in unselected sense amplifier circuits may still be enabled and form charge-sharing relationships between the sense nodes (SEN) and communication nodes (COM). However, the sense node drain circuitry will operate to divert the charge from the sense nodes (SEN), thereby minimizing or eliminating the noise present at the communication nodes (COM) when the sense enable circuits are enabled.

Before turning to the embodiments of FIGS. 12A-13C, a prior art sense amplifier circuit that undesirably adds noise to a communication node (COM) is described with reference to FIGS. 11A-11C. FIGS. 12-13C then show how adding the sense nod isolation control circuitry or the sense node drain circuitry to the sense amplifier circuits minimizes or eliminates the noise present at the communication nodes (COM) in unselected sense amplifier circuits.

Figure 11A:
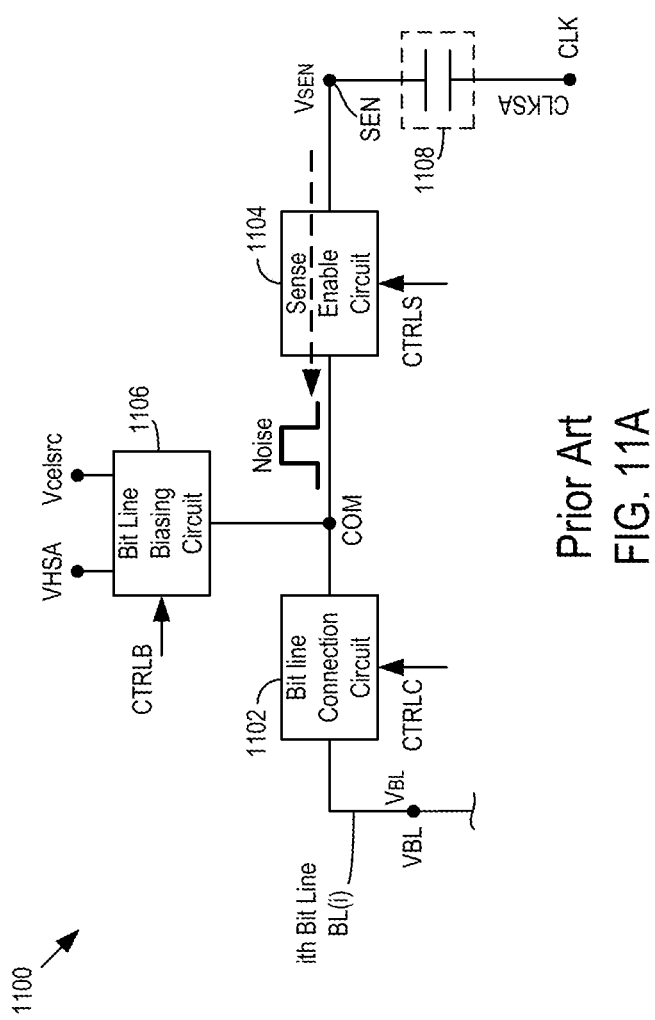
FIG. 11A is a circuit diagram of a sense amplifier circuit in the prior art showing the noise propagating through the circuit in unselected bit lines.

FIG. 11A is a circuit diagram 1100 of a sense amplifier circuit in the prior art showing the noise propagating through the circuit. In the circuit diagram of FIG. 11A, the sense amplifier circuit includes a bit line connection circuit 1102, a bit line biasing circuit 1104, and a sense enable circuit 1106. The bit line connection circuit 1102 is configured to electrically connect and disconnect an ith bit line BL to a remaining portion of the sense amplifier circuit. When the bit line connection circuitry 1102 connects the ith bit line BL(i) to the sense amplifier circuit, current may flow from the sense amplifier circuit 1100 to the ith bit line BL(i). Alternatively, when the bit line connection circuitry 1102 disconnects the ith bit line BL(i) from the sense amplifier circuit, current may be prevented from flowing from the sense amplifier circuit to the ith bit line BL(i).

As shown in FIG. 11A, the bit line connection circuit 1102 is configured to connect the ith bit line BL(i) to the remaining portion of the sense amplifier circuit by connecting it to a communication node (COM). The bit line connection circuit 1102 may be controlled by a bit line connection control signal CTRLC, which may include a single signal or a plurality of signals. For example, the bit line connection circuit 1102 may include at least one switch (e.g., a transistor), and the bit line connection control signal CTRLC may include at least one signal (e.g., a voltage signal) that, at a first level, turns on the at least one switch to connected the ith bit line BL(i) to the communication node (COM), and that, at a second level, turns off the at least one switch to disconnect the ith bit line BL(i) to the communication node (COM).

The sense enable circuit 1104 may provide a path for current to flow from a sense node (SEN) to the communication node (COM) and ultimately to the ith bit line BL(i). In the sense amplifier circuit, a sense voltage $V_{SEN}$ generated at the sense node (SEN) may increase due to charge accumulated at the sense node (SEN). In particular, the sense node (SEN) is coupled to sense node charge circuitry 1108. Example configurations of the sense node charge circuitry 1108 include a charge-storing circuit, such as capacitor, capacitive element, or other active or passive circuit component configured to store charge and generate a voltage based on the stored charge. When configured as or to include a capacitor, the sense node charge circuitry 1108 is referred to as a sense capacitor or sense capacitor charge circuitry.

A clock signal, or at least a voltage pulse of a clock signal CLKSA is applied to a clock node (CLK) coupled to the sense node charge circuitry 1108. As described in further detail below with respect to FIG. 11B, prior to the clock node CLK receiving the voltage pulse CLKSA at the clock voltage level CLKup, the sense node (SEN) is either non-pre-charged, i.e. set to the cell source level Vcel src if in an unselected sense amplifier or a lockout sense amplifier), or pre-charged to a pre-charge sense voltage level VSENS if in a selected sense amplifier or a non-lockout sense amplifier. After the sense node (SEN) is pre-charged to the pre-charge sense level VSENS or set to the cell source level Vcelsrc, the voltage pulse CLKSA at the clock voltage level CLKup is applied to the clock node (CLK). In response to the voltage pulse CLKSA, the sense node charge circuitry 1108 increases the voltage level of the sense voltage $V_{SEN}$ at the sense node (SEN) by the clock voltage level CLKup, causing the sense voltage $V_{SEN}$ on sense node (SEN) to be either Vcelsrc+CLKup in an unselected sense amplifier or lockout sense amplifier, or VSENS+CLKup in a selected sense amplifier or non-lockout sense amplifier. A sense enable control signal CTRLS is used to control the sense enable circuit 1104. For example, the sense enable circuit 1104 may include a switch (e.g., a transistor), and the sense enable control signal CTRLS includes a voltage that, depending on its voltage level, enables the sense enable circuit 1104 by turning on the switch or disables the sense enable circuit 1104 by turning off the switch. When the sense enable circuit 1104 is enabled, current resulting from the charge accumulated at the sense node SEN may flow through the sense enable circuit 1104 and the bit line connection circuit 1102 to the ith bit line BL(i). A voltage level of the sense voltage $V_{SEN}$ after a period of time that the sense enable circuit 1104 is enabled (turned on) provides an indication of a status of a target memory cell coupled to the ith bit line BL(i), such as a program state of the ith bit line BL(i) or whether the target memory cell is sufficiently programmed.

In addition, the bit line biasing circuit 1106 is configured to bias the ith bit line BL(i) by setting a bit line bias voltage $V_{BL}$ at a bit line bias node VBL to a particular voltage level (provided that the bit line connection circuit 1102 is connecting the ith bit line BL(i) to the communication node (COM)). The voltage level of the bit line bias voltage $V_{BL}$ may depend on whether the ith bit line BL(i) is a selected bit line or an unselected bit line. In particular, when the ith bit line BL(i) is a selected bit line, the bit line biasing circuit 1106 may set the bit line bias voltage $V_{BL}$ to a high supply voltage level VHSA or a level corresponding to the high supply voltage VHSA, and when the ith bit line BL(i) is an unselected bit line, the bit line biasing circuit 1106 may set the bit line bias voltage $V_{BL}$ to the cell source voltage level Vcelsrc or a level corresponding to the cell source voltage Vcelsrc. A bit line biasing control signal CTRLB is used to control whether the bit line biasing circuit 1106 sets the bit line bias voltage $V_{BL}$ to the high supply voltage level VHSA or to the cell source voltage level Vcelsrc.

The sense amplifier circuit is configured in one of a non-lockout mode (also referred to as a selected mode) or a lockout mode (also referred to as an unselected mode). In the non-lockout mode, the sense amplifier circuit is active to identify a status of a target memory cell coupled to the ith bit line BL(i)). In the lockout mode, the sense amplifier circuit is inactive to identify a status of the target memory cell. In practice, the sense amplifier circuit is configured in the lockout mode in response to the target memory cell coupled to the ith bit line BL(i) having passed verification (e.g., pass Vvh). In the lockout mode, the sense amplifier circuit skips charging up the target memory cell by biasing the ith bit line BL(i) in a way that prevents cell current from flowing through the ith bit line BL(i), thereby reducing overall current flow through the bit lines over the course of a program-verify operation when programming a group, such as a page, of memory cells. In particular implementations, the bit line biasing circuit 1106 sets the bit line bias voltage $V_{BL}$ to the cell source voltage level Vcelsrc. In lockout mode, the communication node COM may also be set to the cell source voltage level Vcelsrc, since the ith bit line BL(i) is biased at the bit line bias node VBL by way of the communication node (COM).

In effect, the sense amplifier circuit in lockout mode isolates the ith bit line BL(i) and adjacent bit lines from the sense amplifier circuit in that the ith bit line BL(i) is not able to draw current from the charge accumulated at the sense node SEN when the sense enable circuit 1104 is enabled. The hope is that in lockout mode, the sense amplifier circuit does not affect voltage levels or current flow in the ith bit line BL(i) or adjacent bit lines adjacent to the ith bit line BL(i). In this regard, using lockout mode enables a lower overall amount of die current Icc of the memory die 104 during programming.

A level, such as a voltage level, of the bit line biasing control signal CTRLB that controls the bit line biasing circuit 1106 is indicative of whether to configure the sense amplifier circuit in lockout mode or in non-lockout mode. In one example implementation, the bit line biasing control signal CTRLB at a high voltage level or value indicates configuring the sense amplifier circuit in lockout mode, and the bit line biasing control signal CTRLB at a low voltage level or value indicates configuring the sense amplifier in the non-lockout mode. In other example implementations, the bit line biasing control signal CTRLB at a low voltage level or value indicates the lockout mode, and the bit line biasing control signal CTRL at the high voltage level or value indicates the non-lockout mode.

In lockout mode, the sense enable circuit 1104 still is enabled, such as in response to the sense enable control signal CTRLS. As discussed further below with regard to FIG. 11B, the sense enable circuit 1104, when enabled, transmits noise, such as transient noise, from the sense node SEN to the communication node COM, and in turn to the unselected ith bit line BL(i) when the sense amplifier circuit is in lockout mode.

Figure 11B:
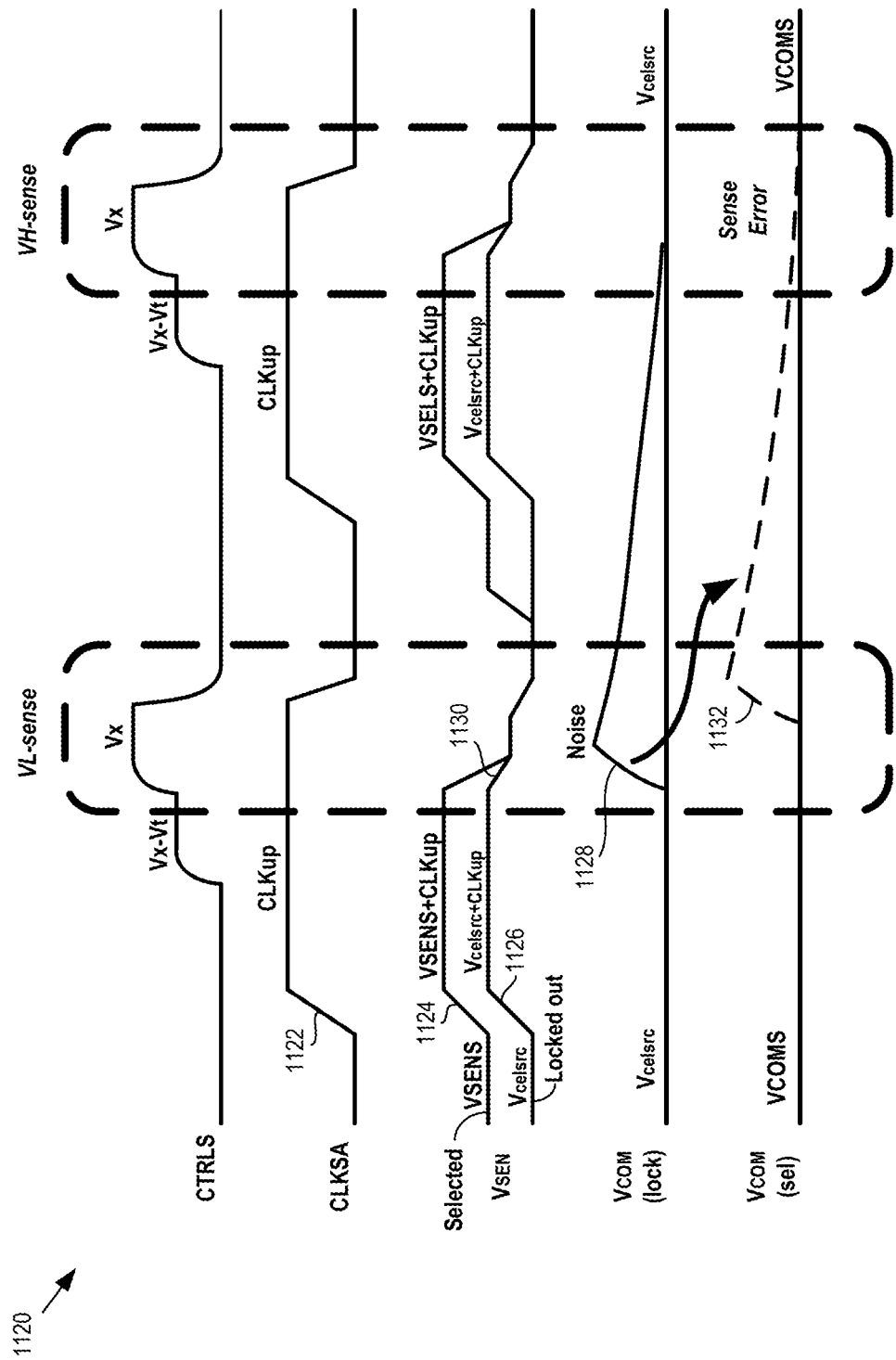
FIG. 11B is a timing diagram of different nodes in the circuit illustrated in FIG. 11A during the VL-sense and the VH-sense.

FIG. 11B is a timing diagram of different nodes in the sense amplifier circuit illustrated in FIG. 11A during at least a portion of a verification operation that includes a low verification portion VL-sense and a high verification portion VH-sense. As discussed above, during or as part of the programming operation, a verification operation is performed during which the voltage supply circuitry applies multiple verification voltages to the word line coupled to the target memory cells during a low verification portion VL-sense and a high verification portion VH-sense (e.g., Vvl and Vvh in FIGS. 10A-C). As shown, the sense enable control signal CTRLS input to the sense enable circuit 1104 is referred to as a universal signal, meaning that the voltage waveform of the sense enable control signal CTRLS is the same regardless of whether the sense amplifier circuit is in lockout mode or in non-lockout mode. In this regard, the sense enable control signal CTRLS is enabled or turned on during the low verification portion VL-sense and the high verification portion VH-sense, regardless of whether the sense amplifier circuit is in lockout mode or non-lockout mode, thereby passing noise (such as noise 1128) from the sense node (SEN) to the communication node (COM), as discussed further below.

FIG. 11B further illustrates clock signal CLKSA, in which the value of the clock signal CLKSA rises at 1122 to a clock voltage level CLKup. The voltage waveform of the sense voltage $V_{SEN}$ generated at the sense node (SEN) is illustrated for both when the sense amplifier circuit is in non-lockout mode (shown in FIG. 11B as "selected") and in lockout mode (shown in FIG. 11B as "locked out"). In non-lockout mode, the selected sense amplifier is configured to pre-charge the sense node (SEN) to a predetermined sense voltage (VSENS), which is greater than zero. In lockout mode, the selected sense amplifier is not configured to pre-charge the sense node (SEN) to the predetermined sense voltage (VSENS), and instead configured to keep the sense node (SEN) biased at a ground level (such as source ground (Vcelsrc)).

As the clock signal (CLKSA) rises at 1122 to the clock voltage level CLKup, the voltage level of the sense voltage $V_{SEN}$, rises regardless of whether the sense amplifier circuit is in lockout mode or in non-lockout mode, as indicated by increasing voltage levels 1124, 1126 for the selected and unselected sense voltages. This is due to the clock signal (CLKSA) being connected, via sense node charge circuitry 1108, to the sense node (SEN). For example, in non-lockout mode, the sense voltage $V_{SEN}$ rises to the predetermined sense voltage level VSENS+the clock voltage (CLKup). In lockout mode, the sense voltage $V_{SEN}$ rises to cell source voltage level Vcelsrc+the clock voltage level (CLKup). Thus, in either lockout mode or non-lockout mode, the sense node charge circuitry 1108 is configured to charge up the sense node (SEN) such that the sense voltage $V_{SEN}$ is at a positive voltage level above the cell source voltage level Vcelsrc.

The voltage waveform of the communication voltage $V_{COM}$ generated at the communication node (COM) in lockout mode is illustrated as $V_{COM}$ (lock) and is initially at a predetermined voltage, such as the cell source voltage level Vcelsrc by being tied to source ground (SRCGND), described further below. The voltage waveform of the communication voltage $V_{COM}$ in non-lockout mode is illustrated as $V_{COM}$ (sel) and is at a predetermined select voltage level VCOMS, which, at least in some example configurations, is determined by the bit line biasing circuitry 1106.

During the low verification portion VL-sense, the voltage level of the sense enable control signal CTRLS increases to enable or turn on the sense enable circuit 1104, resulting in the communication node (COM) in lockout mode receiving current, in the form of "noise" illustrated in FIG. 11B as waveform 1128. As discussed with regard to FIG. 11C, the noise is coupled to an adjacent bit line (such as a selected bit line) resulting in noise 1132. Noise 1132 may result in a sense error during the high verification portion VH-sense, which is used to determine whether the target memory cell has passed verification. In this way, the sense amplifier circuit may suffer from a severe threshold voltage (Vt) downshift by lockout mode. Specifically, when the sense amplifier circuit is in lockout mode, after the voltage pulse of the clock signal CLKSA accumulates charge corresponding to the clock voltage level CLKup at the sense node (SEN), the sense enable control signal CTRLS enables the sense enable circuit 1104, allowing the charge accumulated at the sense node (SEN) to discharge as noise through it to the communication node (COM), charging up the communication node (COM), in turn coupling up the bit line connection circuit 1102, and finally adding noise to one or more non-lockout bit lines. This results in a Vt downshift in sense amplifier circuits configured in non-lockout mode. As a consequence of the Vt downshift, relaxed timing is required to reduce noise, resulting in performance loss.

Figure 11C:
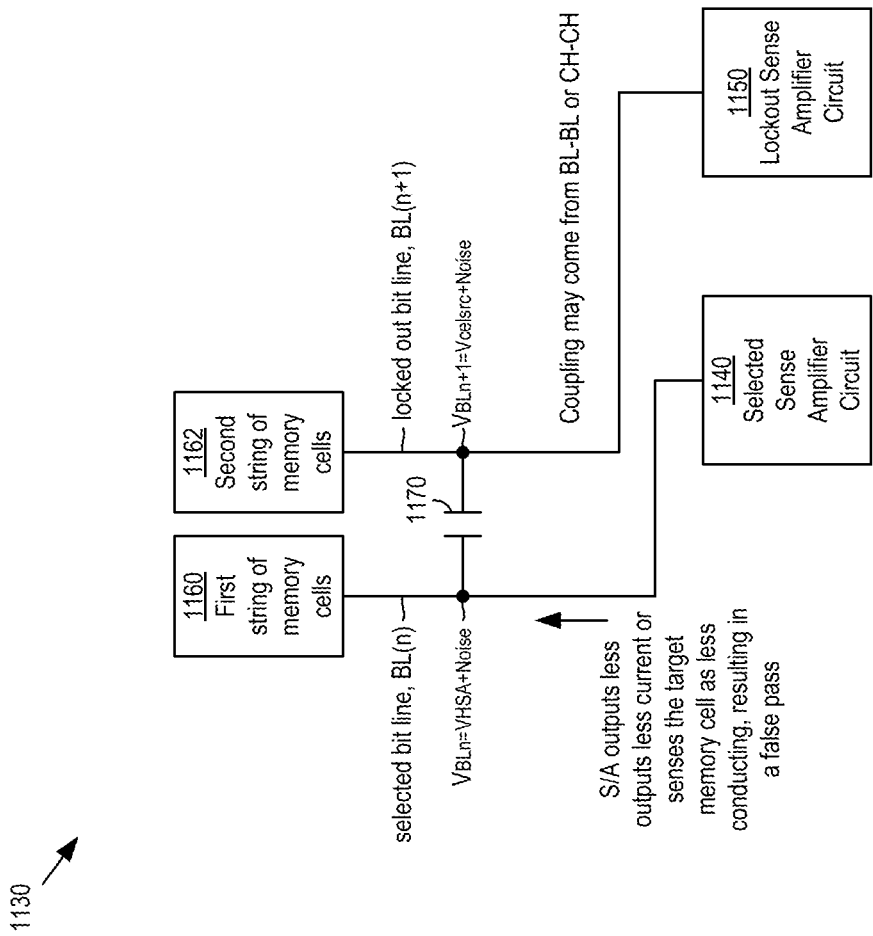
FIG. 11C is a circuit diagram showing the noise generated in the locked out sense amplifier (illustrated in FIG. 11A) propagating to a bit line of a selected sense amplifier.

FIG. 11C is a circuit diagram 1130 showing the noise generated in the locked out sense amplifier circuit (illustrated in FIG. 11A) propagating to a selected (or non-locked out) bit line connected to a selected sense amplifier. Specifically, a first sense amplifier circuit 1140 is configured as a selected sense amplifier circuit in non-lockout mode and connected to an nth selected bit line (BLn), and a second sense amplifier circuit 1150 is configured as an unselected sense amplifier circuit in lockout mode and connected to an (n+1)th bit line (BL(n+1)). Each of the selected and lockout sense amplifier circuits 1140, 1150 may have the circuit configuration of the sense amplifier circuit of FIG. 11A. For a given sense operation, such as a sense operation performed to verify statuses of memory cells during a programming operation, the selected sense amplifier circuit 1140 is connected to a first string of memory cells 1160 by way of the nth bit line BL(n) and configured to sense current through the nth bit line BL(n) in order to detect a status of a target memory cell of the first string of memory cells. The unselected or lockout sense amplifier circuit 1150 is connected to a second string of memory cells 1162 by way of the (n+1)th bit line BL(n+1), and locked out from sensing current through the (n+1)th bit line BL(n+1). In this regard, the nth bit line BL(n) is a selected bit line during the programming operation, whereas bit line the (n+1)th (BL(n+1) is an unselected bit line during the programming operation. As shown, when the sense enable circuit of the lockout sense amplifier circuit 1150 is enabled, noise propagates on locked out bit line BL(n+1), via coupling capacitance 1170, to the selected bit line BL(n). In this way, the voltage $V_{BL}$ on the selected bit line BL(n) includes noise received from the unselected bit line BL(n+1) via capacitance 1170.

Figure 12A:
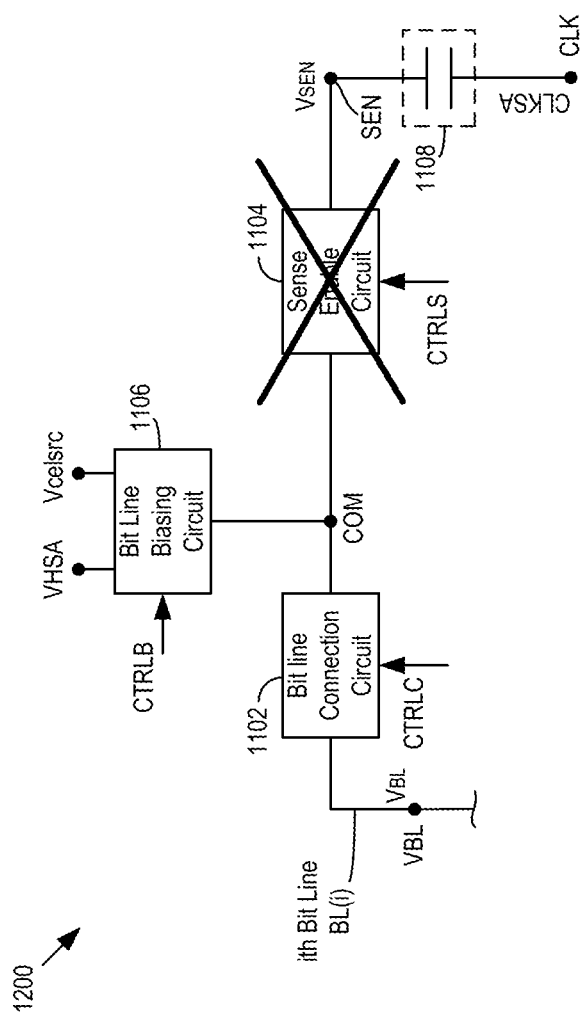
FIG. 12A is a circuit diagram of a locked out sense amplifier circuit according to a first implementation in which noise through the sense node is blocked at a sense enable circuit.

FIG. 12A is a circuit diagram 1200 of a locked out sense amplifier circuit according to a first implementation in which the locked out sense amplifier circuit is configured to block noise from reaching a selected bit line during a sense operation by preventing the sense enable circuit 1104 from passing or transmitting charge accumulated at the sense node SEN to the communication node COM, as indicated by the "X" across the sense enable circuit 1104 in FIG. 12A. As discussed above with respect to FIGS. 11A-11C, the sense node (SEN) may be charged in a lockout mode. This is illustrated at 1126 in FIG. 11B. In order to reduce an effect of the charging of the sense node (SEN) on the communication node (COM), the communication node (COM) may be isolated from the sense node (SEN). In one implementation, the sense enable circuit 1104 may act as a sense node isolation circuit, such as a sense node isolation transistor, configured to isolate the sense node (SEN) from the communication node (COM). Further, as described in further detail below, the sense amplifier circuit may include or be in communication with sense node isolation control circuitry configured to control the sense node isolation transistor in order to isolate the sense node (SEN) from the communication node (COM) in response to coupling the sense amplifier circuit to the unselected bit line.

Figure 12B:
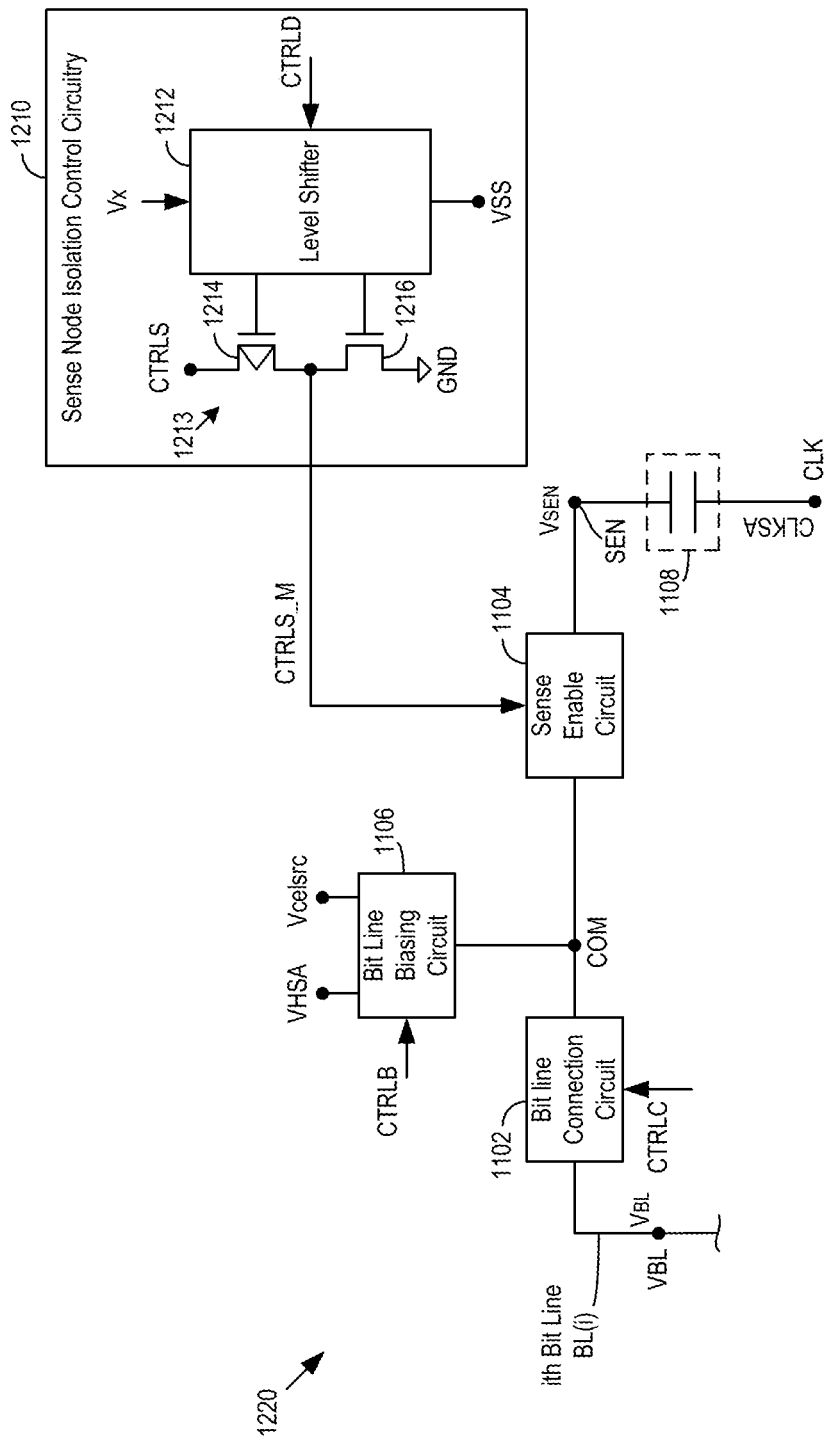
FIG. 12B is a circuit diagram of a first example circuit configured to output a state-dependent control signal to the sense enable circuit of FIG. 12A in order to block the sense enable circuit from transmitting noise from the sense node to the communication node.

FIG. 12B is a first example sense amplifier circuit 1220 that includes or is in communication with sense node isolation control circuitry 1210 configured to generate a modified sense enable control signal CTRLS_M as an input to the sense enable circuit 1104. In response to the sense amplifier circuit configured in the lock out mode, the sense node isolation control circuitry 1210 is configured to output the modified sense enable control signal CTRLS_M at a voltage level that blocks the sense enable circuit 1104 from transmitting noise from the sense node (SEN) to the communication node (COM) during a sense operation. As previously described, the typical sense enable control signal CTRLS that is sent to the sense enable circuit 1104 is a universal signal in that it is applied or output to all sense amplifier circuits connected to memory cells, such as a page of memory cells, that are part of the same sense operation, regardless of whether the specific sense amplifier circuit is in lockout mode or in non-lockout mode. In contrast, FIG. 12B illustrates sense node isolation control circuitry 1210 configured to output a modified sense enable control signal CTRLS_M having a level, such as a voltage level, dependent on a voltage level (value) of a state-dependent control signal CTRLD. The state-dependent control signal CTRLD is state dependent in that the voltage of the state-dependent control signal CTRLD is at a voltage level dependent on whether the sense amplifier circuit is configured as a selected sense amplifier circuit (i.e., is in the lockout mode) or is configured as an unselected sense amplifier circuit (i.e., is in the non-lockout mode). By being state-dependent, the voltage level of the state-dependent control signal CTRLD is at a predetermined unselected or lockout voltage level in response to the sense amplifier circuit in lockout mode, and is at a predetermined selected or non-lockout voltage level in response to the sense amplifier circuit in non-lockout mode. In one example configuration, the unselected or lockout voltage level is an associated high voltage level (e.g., 1 V) and the selected or non-lockout voltage level is an associated low voltage level (e.g., 0 V). Other configurations where the selected voltage level is at the high voltage level and the unselected voltage level is at the low voltage level may be possible.

In some example configurations, the state-dependent control signal CTRLD is a pre-existing state-dependent control signal used by and/or input to the sense amplifier circuit, examples of which include the bit line biasing control signal CTRLB and/or an unselect voltage $V_U$ generated and output from a latch circuit coupled to the sense amplifier circuit. In other example configurations, a control signal generator, such as the sense circuit controller 1406 of FIG. 14 (described below), is configured to generate the state-dependent control signal CTRLD as a new signal independent from other state-dependent signals or voltages. Such state-dependent signals are indicative that the sense amplifier circuit is to be in lockout mode or in non-lockout mode. A state-dependent signal at a level indicating that the sense amplifier circuit is to be in lockout mode may be referred to as a lockout signal indicative of locking out the sense amplifier circuit during a programming operation, and a state-dependent signal at a level indicating that the sense amplifier circuit is to be in non-lockout mode may be referred to as a lockout signal indicative of not locking out the sense amplifier circuit during a programming operation.

By having a voltage level dependent on the voltage level of the state-dependent control signal CTRLD, the modified sense enable control signal CTRLS_M is itself a state-dependent control signal in that the voltage level of the modified sense enable control signal CTRLS_M depends on whether the sense amplifier circuit is in the lockout mode or in the non-lockout mode. In particular, when the sense amplifier circuit is in the lockout mode (i.e., it is unselected), the sense node isolation control circuitry 1210 is configured to generate the modified sense enable control signal CTRLS_M at a voltage level that disables the sense amp enable circuit 1104 during a duration of the sense operation. This way, during the sense operation when the sense node SEN accumulates charge in response to a voltage pulse of the clock signal CLKSA, the modified sense enable control signal CTRLS_M keeps the sense enable circuit 1104 disabled or turned off so that the sense enable circuit 1104 does not add noise on the communicating node (COM) by transmitting the accumulated charge on the sense node (SEN) to the communication node (COM) as noise during the sense operation. On the other hand, when the sense amplifier circuit is in non-lockout mode, the voltage waveform of the modified sense enable control signal CTRLS_M is the same as or mirrors the voltage waveform of the typical sense enable control signal CTRLS so that the sense enable circuit 1104 turns on at appropriate times during high and low verification operations in order to allow current to flow from the sense node (SEN) to the communications node (COM) for proper operation of sense amplifier circuit in the non-lockout mode.

The sense node isolation control circuitry 1210 may include a level shifter circuit 1212 and an inverter circuit 1213. In some example configurations, such as the one shown in FIG. 12A, the inverter circuit 1213 includes a p-channel metal-oxide-semiconductor field-effect transistor (PMOS transistor) 1214 and an n-channel metal-oxide-semiconductor field-effect transistor (NMOS transistor). Gate terminals of the PMOS and NMOS transistors 1214, 1216 are connected to an output of the level shifter circuit 1212, and drain terminals of the PMOS and NMOS transistors 1214, 1216 are connected together to form an output node of the inverter circuit 1213, where the inverter circuit 1213 generates and outputs the modified sense enable control signal CTRLS_M.

In general, the inverter circuit 1213 is included to logically invert the lockout level of the state-dependent control signal CTRLD to a level that disables or turns off the sense enable circuit 1104 in response to the sense amplifier circuit configured in lockout mode. For example, the lockout level of the state-dependent control signal CTRLD is a high level (e.g., 1 V), and the level to disable or turn off the sense enable circuit 1104 is a low level (e.g., 0 V). In response to the state-dependent control signal CTRLD at its associated high level, the NMOS transistor 1216 will turn on and pull down the modified sense enable control signal CTRLS_M to its associated low level (e.g., ground (GND)) so that the sense enable circuit 1104 is disabled and isolates the sense node (COM) from the communication node (COM) throughout the duration of the sense operation.

On the other hand, in response to the sense amplifier circuit configured in the non-lockout mode, the sense node isolation control circuitry 1210 is configured to generate the modified sense enable control signal CTRLS_M to have a voltage waveform that is the same as or mirrors the voltage waveform of the universal sense enable control signal CTRLS so that the sense enable circuit 1104 turns on at appropriate times during high and low verification operations in order to allow current to flow from the sense node (SEN) to the communications node (COM) for proper operation of sense amplifier circuit in the non-lockout mode. To do so, the PMOS transistor 1214 has its source configured to receive the universal sense enable control signal CTRLS. This way, in response to the state-dependent control signal CTRLD at its associated low level, the PMOS transistor 1216 will generate and output the modified sense enable signal CTRLS_M at a voltage level that is the same as or mirrors the voltage waveform of the sense enable control signal CTRLS it is receiving at its source.

Also, in some example configurations, such as the one shown in FIG. 12A, the level shifter 1212 may be included because the high voltage level (e.g., the lockout level) of the state dependent control signal CTRLD may be lower than the high voltage level Vx to turns on the sense enable circuit 1104. In turn, the high unselect level of the state-dependent control signal CTRLD may be insufficient to adequately turn on the NMOS transistor 1216 and turn off the PMOS transistor 1214 in lockout mode. Accordingly, the level shifter circuit 1212 may be included in order to convert the lockout level of the state-dependent signal CTRLD to the high voltage level Vx at which the modified sense enable control signal CTRLS is at during the high and low verification operations in order to sufficiently turn on the NMOS transistor 1216 and turn off the PMOS transistor 1214 in response to the sense amplifier circuit in the lockout mode.

Figure 12C:
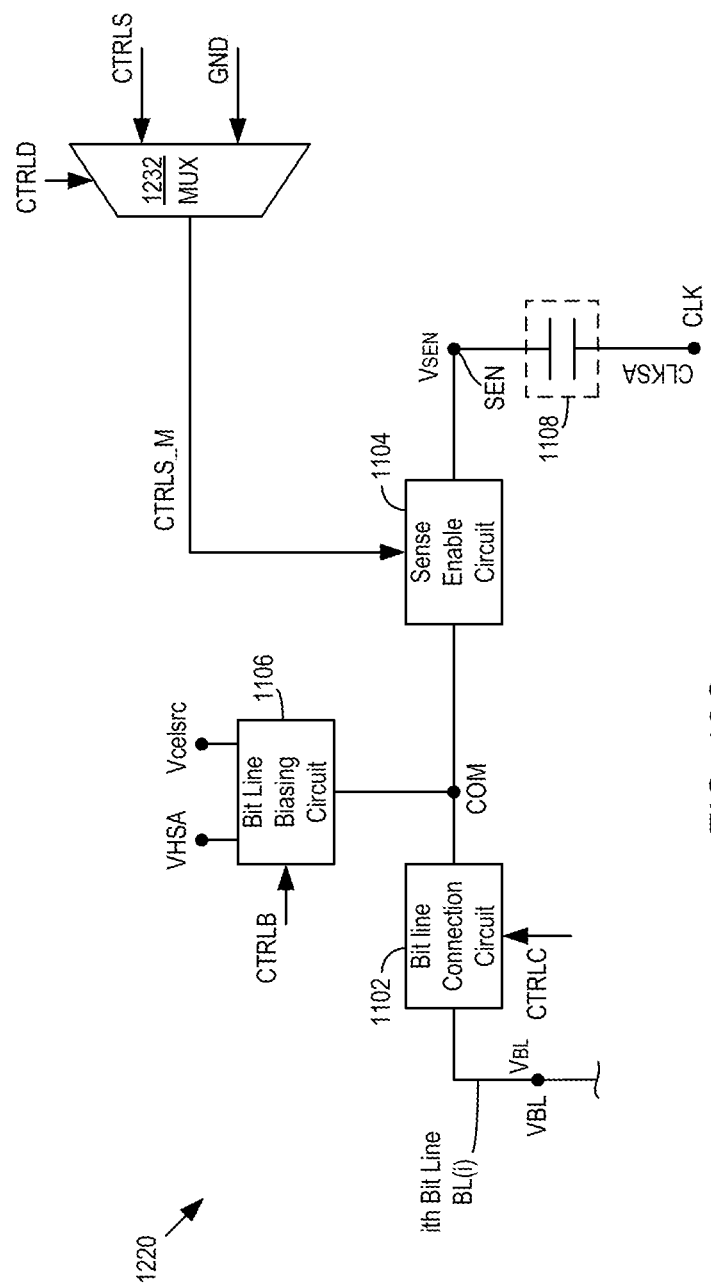
FIG. 12C is a circuit diagram of a second example circuit configured to output a state-dependent control signal to the sense enable circuit of FIG. 12A in order to block the sense enable circuit from transmitting noise from the sense node to the communication node.

FIG. 12C is a second example circuit of a sense node isolation control circuitry 1232 configured to generate the modified sense enable control signal CTRLS_M, which controls the sense enable circuit 1104. Instead of level shifter 1212 and inverter circuit 1213, a multiplexer (MUX) 1232 is used to generate the modified sense enable control signal CTRLS_M. As shown in FIG. 12C, the inputs to the MUX 1232 are the universal sense enable control signal CTRLS, ground (GND), and the state-dependent control signal CTRLD. The multiplexer 1232 is configured to receive the state-dependent control signal CTRLD at its select input and generate the modified sense enable control signal CTRLS_M based on the level of the state-dependent control signal CTRLD. That is, the state-dependent control signal operates as a select signal to the multiplexer 1232 that controls whether the multiplexer 1232 outputs the universal sense enable signal CTRLS as the modified sense enable control signal CTRLS_M or outputs the modified sense enable control signal CTRLS at the ground voltage level GND. In particular, similar to FIG. 12B, responsive to the state-dependent control signal CTRLD being at the select or unselect level indicative to configure the sense amplifier circuit in lockout mode, the multiplexer (MUX) 1232 is configured to output the modified sense enable control signal CTRLS_M at the ground voltage level GND, turning off the sense enable circuit 1104, thereby isolating the sense node (SEN) from the communication node (COM). Responsive to the state-dependent control signal CTRLD being at the select or non-lockout level indicative to configure the sense amplifier circuit in non-lockout mode, the multiplexer (MUX) 1232 is configured to pass the universal sense enable control signal CTRLS to the output of the multiplexer (MUX). In this way, the sense node isolation control circuitry 1232 either blocks the charge-sharing relationship between the sense node (SEN) and the communication node (COM) in response to the sense amplifier circuit in lockout mode, or allows the charge-sharing relationship to form in response to the sense amplifier circuit in non-lockout mode.

Figure 12D:
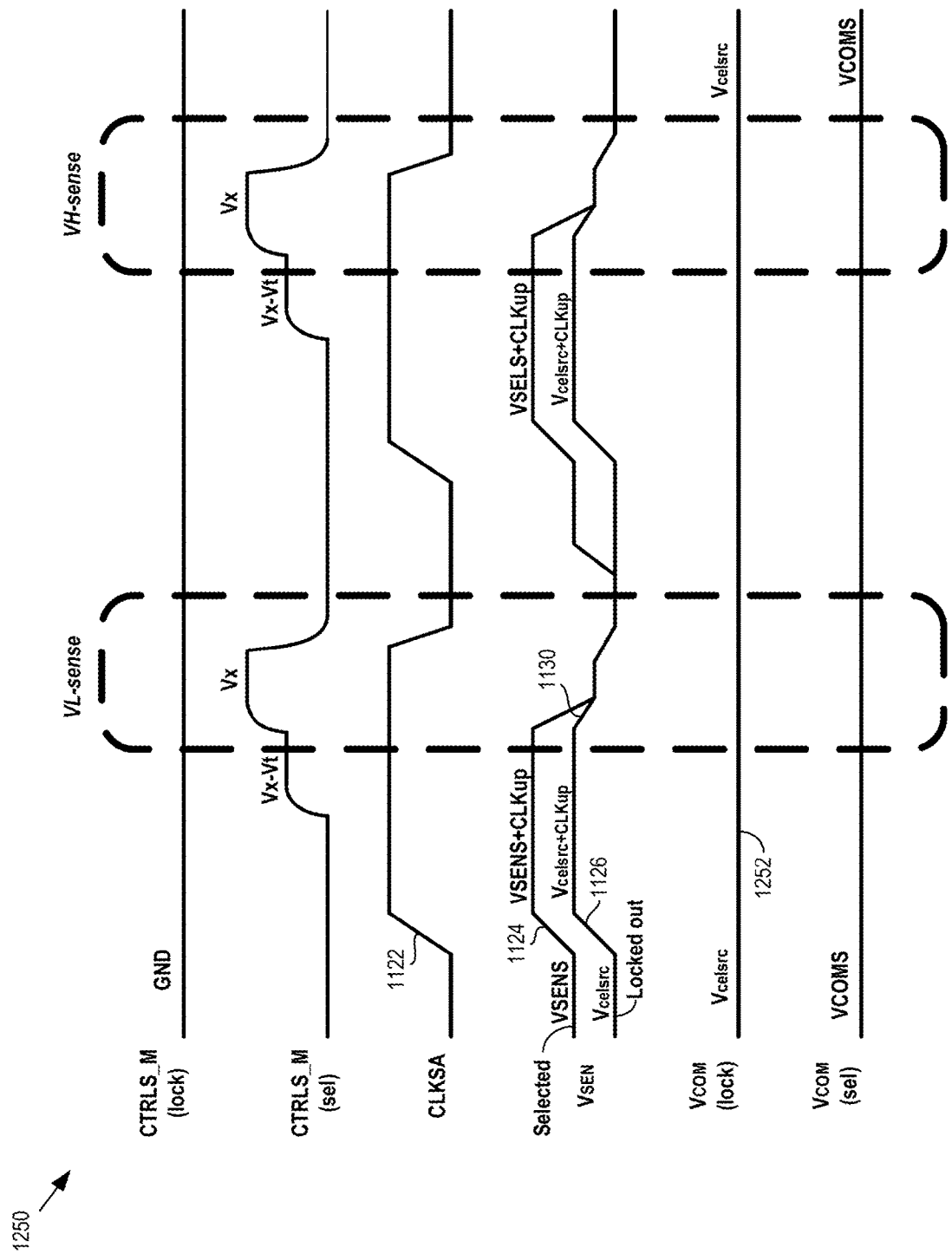
FIG. 12D is a timing diagram of different nodes in the circuit illustrated in FIGS. 12A-C during a verify operation.

FIG. 12D is a timing diagram of different nodes in the sense amplifier circuit illustrated in FIGS. 12A-C during a verification operation that includes the low verification portion VL-sense and the high verification portion VH-sense. As shown, the sense node isolation control circuitry 1210 (FIG. 12B) or 1232 (FIG. 12C) maintains the modified sense enable control signal CTRLS_M at the ground voltage level (GND) during the verification operation, including the time periods of both the low and high verification portions VL-sense, VH-sense when the sense amplifier circuit is in lockout mode. The voltage waveforms of the clock signal (CLKSA), the sense voltage $V_{SEN}$ for non-lockout and for lockout are the same as in FIG. 11B. However, FIG. 12D shows that by applying the modified sense enable control signal CTRLS_M to the sense enable circuit 1104, the communication voltage $V_{COM}$ generated at the communication node (COM) has a state-dependent voltage level. In lockout mode, the sense amplifier circuit holds the communication voltage $V_{COM}$ at a predetermined voltage, such as the cell source voltage level Vcelsrc, during the duration of the verification operation, including during the low and high verification portions VL-sense, VH-sense, as indicated by straight line 1252 in FIG. 12D, because the sense enable circuit 1104 in the unselected sense amplifier circuit maintains being disabled during the verification operation to prevent noise from influencing the voltage level of the communication voltage $V_{COM}$. Further, in non-lockout mode, the sense amplifier circuit generates the communication voltage $V_{COM}$ at the select voltage level VCOMS, and is able to maintain the communication voltage $V_{COM}$ at this select voltage level VCOM during the entire duration of the verification operation, as indicated by straight line 1254, thus indicating a lack of effect from noise from the sense node (SEN) of an unselected sense amplifier circuit.

Figure 13A:
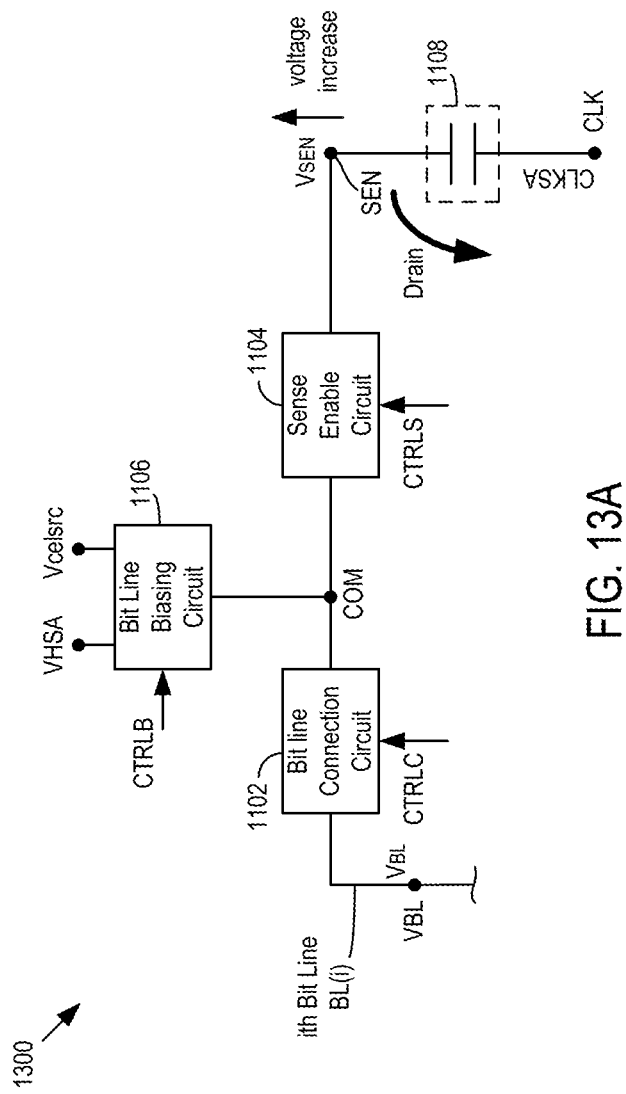
FIG. 13A is a circuit diagram of a locked out sense amplifier circuit according to a second implementation in which noise from the sense node is reduced by draining the sense node.

FIG. 13A is a circuit diagram 1300 of a locked out sense amplifier circuit according to a second implementation in which noise from the sense node (SEN) is reduced by draining the sense node (SEN). As discussed above, the sense node (SEN) may be charged in a lockout mode, which is illustrated by the voltage level increase of the sense voltage $V_{SEN}$ in a locked out sense amplifier 1126 in FIG. 11B. In order to reduce an effect of the charging of the sense node (SEN) on the communication node (COM), the sense node (SEN) may be drained of at least part of the charge. In particular, FIG. 13A illustrates that the sense node (SEN) has a voltage increase, and a corresponding drain of charge, in order to reduce the effect of noise from the sense node (SEN). As discussed above with respect to FIG. 11B, sense node charge circuitry 1108 is configured to charge the sense node (SEN) in response to receipt of a voltage pulse of a clock signal CLKSA applied to a clock node CLK. The following embodiment describes a sense amplifier circuit that includes or is in communication with sense node drain circuitry configured to drain charge from the sense node (SEN) in response to the sense node charge circuitry charging the sense node (SEN) and the sense amplifier circuit connected to the unselected bit line.

Figure 13B:
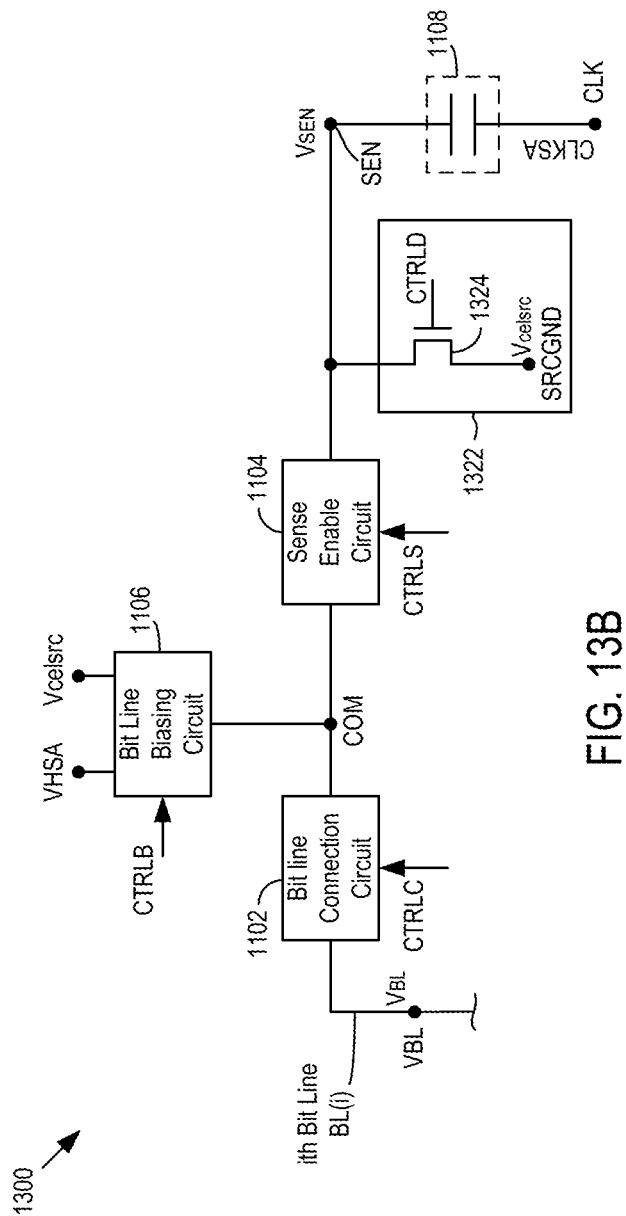
FIG. 13B is a circuit diagram of an example circuit configured to drain the sense node of the sense amplifier circuit of FIG. 13A by electrically connecting the sense node to prevent the sense enable circuit from transmitting noise from the sense node to the communication node.
Figure 13C:
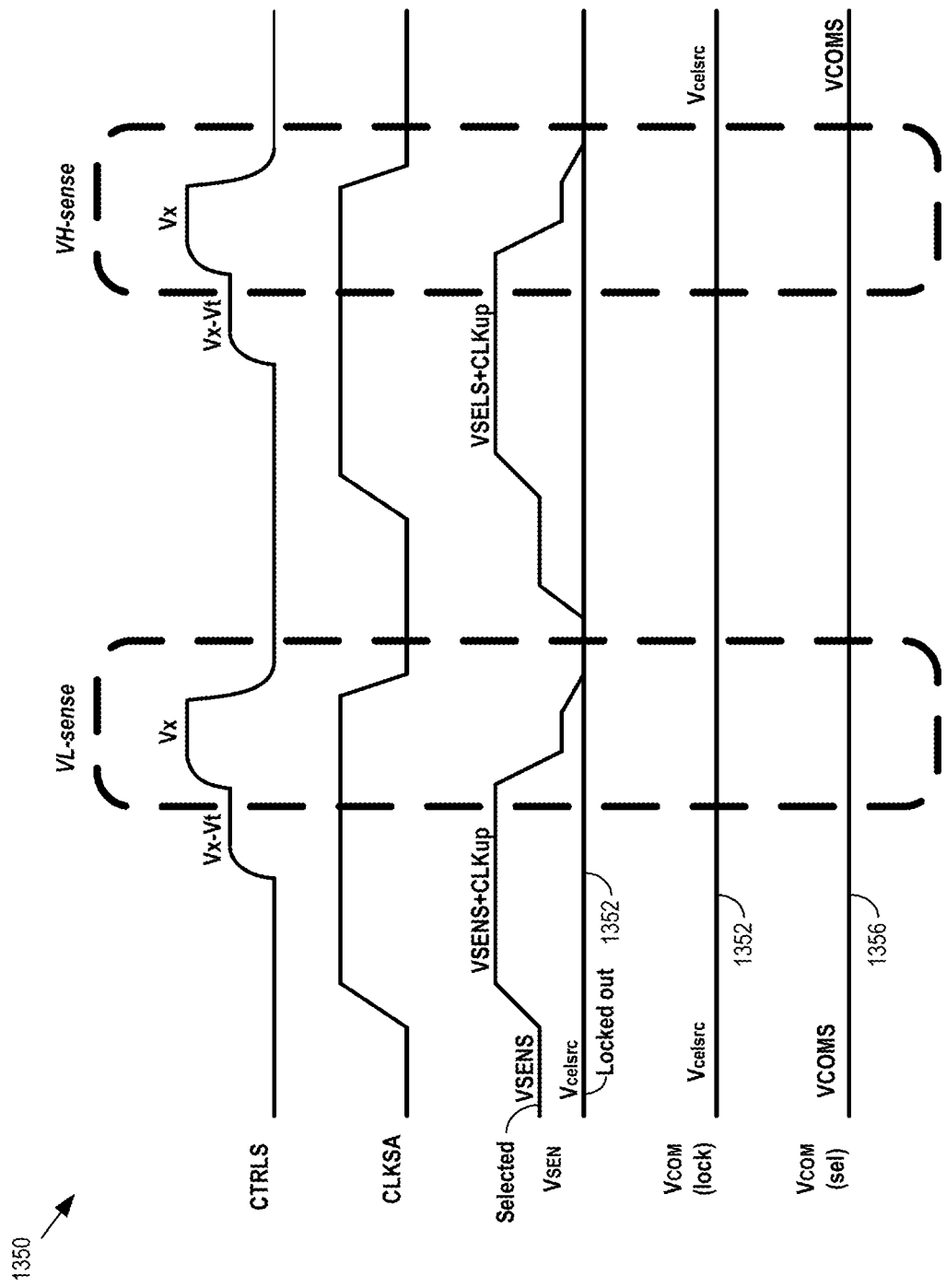
FIG. 13C is a timing diagram of different nodes in the circuit illustrated in FIGS. 13A-B during a verify operation.

FIG. 13B illustrates one example of the sense node drain circuitry 1322. In a particular example configuration, the sense node drain circuitry 1322 includes a transistor, and in particular an NMOS transistor 1324, with a first (drain) terminal connected to the sense node (SEN) and between the sense node (SEN) and the sense enable circuit, a (second) source terminal connected to ground (such as source ground SRCGND biased to the cell source voltage level Vcelsrc), and a gate terminal configured to receive the state-dependent control signal CTRLD. As previously described, the state-dependent control signal CTRLD may be a pre-existing state dependent control signal used by the sense amplifier circuit, such as the bit line biasing control signal CTRLB and/or a latch voltage generated by a latch circuit coupled to the sense amplifier circuit. In the embodiment shown with respect to FIG. 13B, the unselect or lockout voltage level of the state-dependent control signal CTRLB is an associated high voltage level configured to turn on the NMOS transistor 1324, and the select or non-lockout voltage level of the state-dependent control signal CTRLB is an associated low voltage level configured to turn off the NMOS transistor 1324. Accordingly, when the state-dependent control signal CTRLB is at the high, unselect or lockout voltage level (indicating that the sense amplifier circuit is in lockout mode), the transistor 1324 turns on and connects the sense node (SEN) to the source ground SRCGND. When turned on, the transistor 1324 acts as a drain circuit by draining the sense node (SEN). The drain transistor 1324 acts as a drain circuit by providing a conductive or electrical path for accumulated charge on the sense node (SEN) to flow, move, or discharge from the sense node (SEN) to another location of the circuit, such as the source ground (SRCGND). In this way, by electrically connecting the sense node (SEN) to the source ground SRCGND, the sense node drain circuitry 1322 prevents charge accumulated on the sense node (SEN) from flowing through sense enable circuit 1104 even if the sense enable circuit 1104 is enabled or turned on to allow charge to flow through it to the communication node (COM). The sense node drain circuitry 1322 prevents the charge from flowing to the communication node (COM) by way of the sense enable circuit 1104 by diverting the charge to the source ground (SRCGND). In this way, the sense node drain circuitry 1322 blocks or prevents noise from the sense node (SEN) to the communication node (COM) in an unselected or locked out sense amplifier circuit, and in turn onto selected bit lines, during a verification operation.

Accordingly, in the embodiment described with reference to FIG. 13B, the same universal sense enable control signal CTRLS is applied to the sense enable circuits of the selected (non-locked out) sense amplifiers and the unselected (locked out) sense amplifiers during the verification operation. However, in the unselected sense amplifiers, the charge accumulated on the sense nodes (SEN) when the sense node charge circuitry 1108 receive a voltage pulse of the clock signal CLKSA is immediately discharged from the sense nodes (SEN) because the sense node train circuitry 1322 is activated to drain the accumulated charge to the source ground (SRCGND). Accordingly, during the low and high verification portions of the verification process, when the universal sense enable control signal CTRLS enables or turns on the sense enable circuits 1104 in the unselected sense amplifiers, there is no noise for those unselected sense enable circuits 1104 to transmit to the communication nodes (COM). However, in the selected or non-locked out sense amplifiers, their sense node drain circuits 1322 will receive the state-dependent control signal CTRLD at the selected or non-lockout voltage level, which is a low voltage level that turns or leaves off the sense node drain circuits 1322. Accordingly, the sense node drain circuits 1322, when disabled or turned off, do not drain the charges accumulated on the sense nodes (SEN), and instead leave the charge accumulated on the sense nodes (SEN). As such, even though the sense amplifier circuits in the non-lockout mode have or are in communication with sense node drain circuits 1322, their sense node drain circuits 1322 are disabled so that the sense voltages $V_{SEN}$ remain at the increased clock levels, increased by the clock voltage level CLKup, until the sense enable circuits 1104 are enabled during the low and high verification portions of the verification operation. Accordingly, when the sense enable circuits 1104 of the selected sense amplifiers turn on during the low and high verification portions of the verification process, the charge accumulated on the sense nodes (SEN) will flow through the sense enable circuits 1104 to the communication nodes in accordance with the statuses of the target memory cells coupled to the selected bit lines for proper operation of the selected sense amplifier circuits.

FIG. 13C is a timing diagram 1350 of different nodes in the sense amplifier circuit illustrated in FIGS. 13A-B during a verification operation that includes a low verification portion VL-sense and a high verification portion VH-sense. As illustrated, the sense enable control signal CTRLS has the same voltage waveform for both when applied to sense enable circuits 1104 of sense amplifier circuits in the lockout mode and when applied to sense enable circuits 1104 of sense amplifier circuits in the non-lockout mode. In this regard, timing diagram 1350 is different from timing diagram 1250, where the voltage waveforms of the sense enable control signals CTRLS are state-dependent. Likewise, the clock signal (CLKSA) applied to clock nodes CLK of, and sense voltages $V_{SEN}$ generated in selected or non-lockout sense amplifiers circuits have the same voltage waveforms as those in FIG. 11B. However, in FIG. 13C, the sense voltage $V_{SEN}$ generated on sense nodes (SEN) in unselected or lockout sense amplifier circuits is held at cell source voltage level Vcelsrc, as indicated by straight line 1352. This is due to the sense node drain transistor 1324 draining any charge pumped to the sense node (SEN) in response to a voltage pulse of the clock signal CLKSA, thereby keeping the sense voltage $V_{SEN}$ at the predetermined cell source voltage Vcelsrc. Likewise, the unselected or lockout sense amplifier circuits hold the communication voltages $V_{COM}$ at the cell source voltage Vcelsrc, as indicated by straight line 1354 during the low and high verification portions of the verification process because their sense enable circuits 1104 do not have any charge to transmit to the communication nodes (COM). Further, the selected or non-locked out sense amplifier circuits generate their the communication voltages $V_{COM}$ at the select voltage level VCOM during the entire duration of the verification operation, as indicated by straight line 1356, thus indicating a lack of effect from noise from the sense node (SEN) of an unselected sense amplifier circuit.

Figure 14:
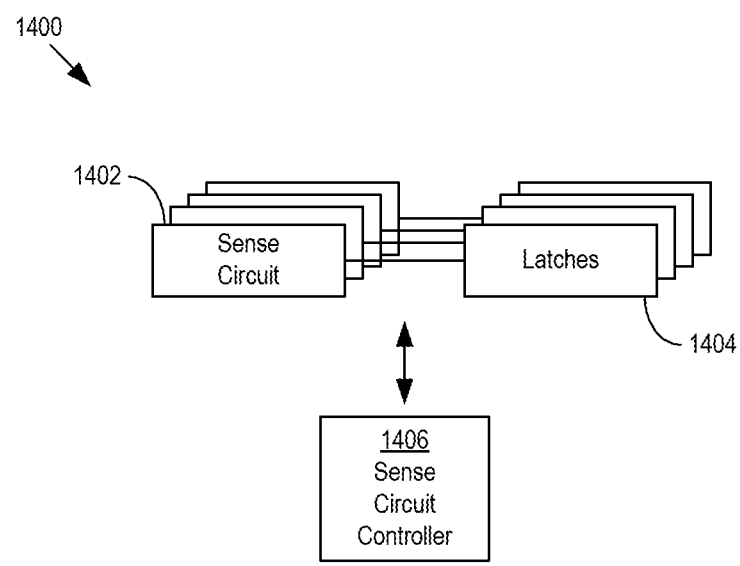
FIG. 14 is a block diagram of an example configuration of a sense block of FIG. 2B.

FIG. 14 is a block diagram of an example configuration of a sense block 1400, which may be representative of one of the sense blocks 146(1) to 146(p) of FIG. 2B. Specific examples of the sense block are illustrated by 1200, 1220, 1230 of FIGS. 12A-C or 1300, 1320 of FIGS. 13A-B. The sense block 1400 may include a plurality of sense circuits 1402 and a plurality of sets of latches 1404. Each sense circuit (also referred to as a sense amplifier circuit) 1402 may be associated with a respective one of the latches 1404. That is, each sense circuit 1402 may be configured to communicate with and/or perform a sense operation using data and/or storing data into its associated latches set 1404. Additionally, the sense block 1400 may include a sense circuit controller 1406 that is configured to control operation of the sense circuits 1402 and the sets of latches 1404 of the sense block 1400. Specific examples of the sense circuit controller 1406 may include sense node isolation control circuitry 1210. As described in further detail below, the sense circuit controller 1406 may control operation of the sense circuits 1402 and the latches 1404 by outputting control signals to terminals of the sense circuits 1402 and the latches 1404. Additionally, the sense circuit controller 1406 may communicate with and/or may be a part of the control logic 154. The sense circuit controller 1406 may be implemented in hardware, or a combination of hardware and software. For example, the sense circuit controller 1406 may include a processor that executes computer instructions stored in memory to perform at least some of its functions.

Figure 15A:
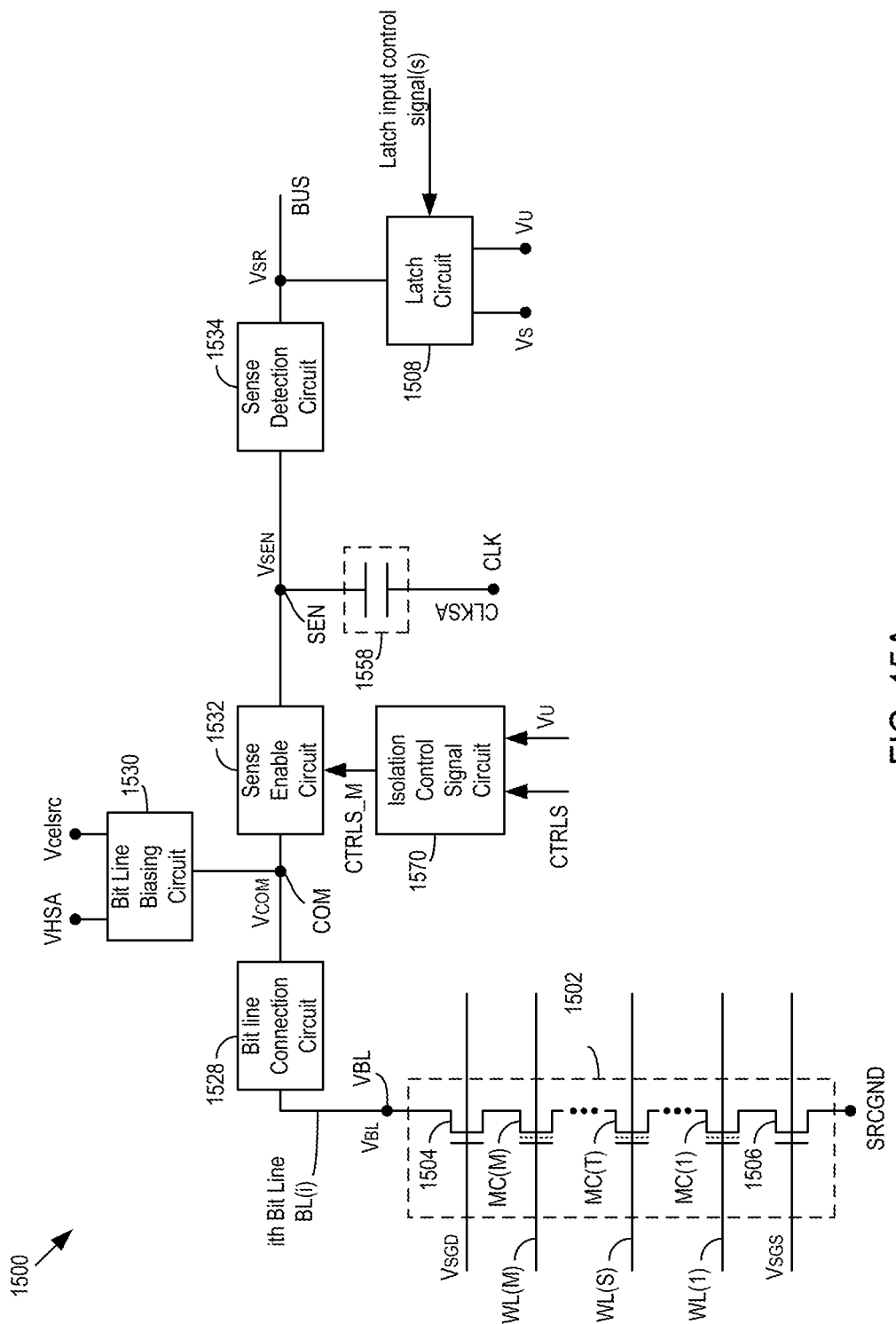
FIG. 15A is a block diagram of an example configuration of a sense circuit of the sense block of FIG. 14 with isolation control signal circuitry.
Figure 15B:
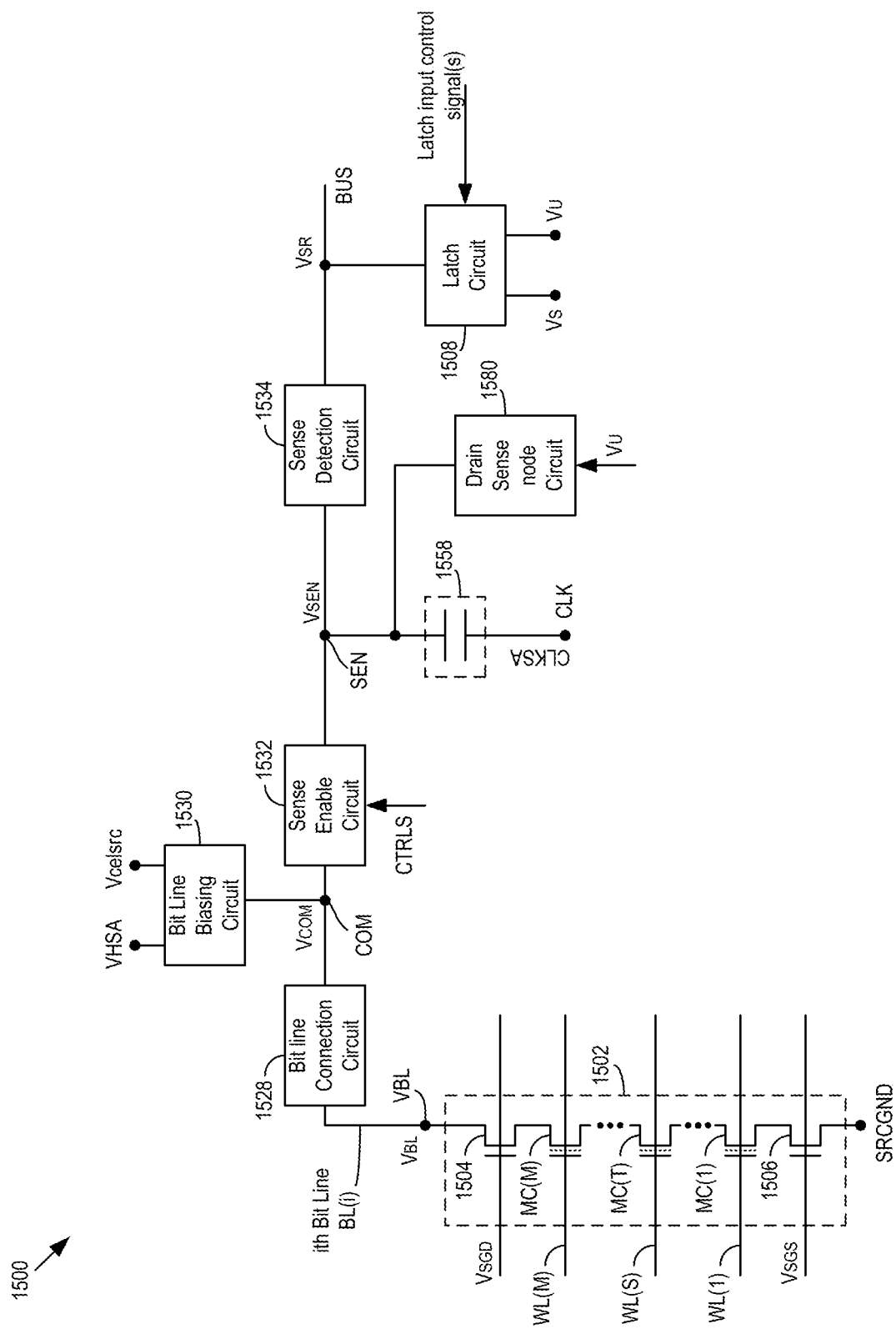
FIG. 15B is a block diagram of an example configuration of a sense circuit of the sense block of FIG. 14 with drain sense node circuitry.

FIG. 15A is a circuit schematic of a first example sense amplifier circuit 1500 that may be representative of one of the sense circuits 1402 of the sense block 1400 of FIG. 14, and/or included in one of the sense blocks 146 of FIG. 2B. FIG. 15B is a circuit schematic of a second example sense amplifier circuit 1500 that may be representative of one of the sense circuits 1402 of the sense block 1400 of FIG. 14, and/or included in one of the sense blocks 146 of FIG. 2B. FIGS. 15A and 15B are identical except for isolation control signal circuit 1570 and drain sense node circuit 1580, discussed below. Thus, any discussion below regarding sense amplifier circuit 1500 is applicable to sense amplifier circuit 1500.

In FIG. 15A, the ith bit line BL(i) is connected to an associated NAND string 1502. The ith bit line BL(i) may be one of a plurality bit lines and the NAND string 1502 may be one of a plurality of NAND strings included in a memory cell structure 142 of one of the memory dies 104. The NAND string 1502 includes an M-number of memory cells MC(1) to MC(M). For purposes of illustration, one of the memory cells MC(1) to MC(M) is identified as being a target memory cell MC(T). For a read operation, the target memory cell MC(T) is a memory cell from which data is to be read and thus, for which a sense operation is performed. For a verification operation, the target memory cell MC(T) is a memory cell being programmed in an associated program-verify operation. FIG. 15A shows the target memory cell MC(T) connected to a selected word line WL(S). FIG. 15A also shows the NAND string 1502 including, on its drain side, a drain select gate transistor 1504 configured to receive a drain select gate voltage $V_{SGD}$ at its control gate, and including, on its source side, a source select gate transistor 1506 configured to receive a source select gate voltage $V_{SGS}$ at its control gate. FIG. 15A also shows the ith bit line BL(i) and associated NAND string 1502 connected to a bit line bias node VBL on its drain side, where the ith bit line is configured to be biased with a bit line bias voltage $V_{BL}$. In addition, the ith bit line BL(i) is connected to a source ground node SRCGND, which is connected to an associated source line SL. As described in further detail below, the source ground node SRCGND may be biased with the cell source voltage Vcelsrc.

The sense amplifier circuit 1500 is configured to sense an amount of the cell current conducted or drawn through the ith bit line BL(i) as part of a memory operation associated with the target memory cell MC(T), such as a read operation to read data that the target memory cell MC(T) is storing or a verify operation to verify that data is sufficiently programmed in the target memory cell MC(T). Based on the current sensing that the sense amplifier circuit 1500 performs, the sense amplifier circuit 1500 may generate and output a sense result signal $V_{SR}$ on an output node or communications bus BUS that indicates a status of the target memory cell MC(T).

As examples, in situations where the sense amplifier circuit 1500 performs a sense operation as part of a read operation, the status of the target memory cell MC(T) may be a program state in which the target memory cell MC(T) is programmed. As previously described, the program state may be one of a plurality of possible program states in which the target memory cell MC(T) can be programmed. Each of the plurality of program states may correspond to a different one of a plurality of logic or data values for data that the target memory cell MC(T) can store. In turn, an identification of a program state in which the target memory cell MC(T) is in is an identification of the logic or data value of the data that the target memory cell MC(T) is storing. Accordingly, where the status of the target memory cell MC(T) is the state of the target memory cell MC(T), the level, such as a voltage level, of the sense result signal $V_{SR}$ may indicate the program state of the target memory cell MC(T) and/or the logic value of the data that the target memory cell MC(T) is storing. As another example, the status of the target memory cell MC(T) is a status of whether a threshold voltage $V_{TH}$ of the target memory cell MC(T) is above or below a certain read voltage level. Accordingly, the level of the sense result signal $V_{SR}$ may indicate whether the threshold voltage $V_{TH}$ of the target memory cell MC(T) is above or below a certain read reference voltage level Vr.

As another example, in a situation where the sense amplifier circuit 1500 performs the sense operation as part of a verify operation, that status of the target memory cell MC(T) is a status of whether the target memory cell MC(T) is sufficiently programmed to its assigned program state. Accordingly, the level of the sense result signal $V_{SR}$ may indicate whether the target memory cell MC(T) is sufficiently programmed to its assigned memory state, or whether another program operation is needed to sufficiently program the target memory cell MC(T).

In addition or alternatively, the status of the target memory cell MC(T) includes an indication of how the target memory cell MC(T) behaves or responds and/or a behavior or response of the target memory cell MC(T) in response to being biased according to certain biasing conditions during the sense operation. The biasing may include the sense amplifier circuit 1500 biasing the ith bit line BL(i) with a bit line bias voltage, which in turn biases the target memory cell MC(T). Other or additional biasing may include biasing the selected word line WL(S) connected to the target memory cell MC(T) with a word line voltage at a certain voltage level, such as a certain read voltage level or a certain verify voltage level. The target memory cell MC(T) may behave or respond differently to a certain biasing condition depending on its status. That is, memory cells with different statuses may respond differently to the same set of biasing conditions. One way a target memory cell MC(T) responds or behaves differently is by drawing different amounts of current through the ith bit line BL(i). In other words, the status identified during the sense operation characterizes or indicates a behavior of the target memory cell MC(T) in response to being biased during the sense operation, which in turn indicates the status of the target memory cell MC(T), and which in turn indicates certain information for which the sense operation is performed, such as the data value that the target memory cell MC(T) is storing, whether the target memory cell MC(T) has a threshold voltage $V_{TH}$ above or below a certain read voltage level, or whether the target memory cell MC(T) is sufficiently programmed.

In addition, the sense amplifier circuit 1500 is connected to and/or in communication with a latch (or latch circuit) 1508, which, for at least some example configurations, may be representative of one of a plurality or collection of latches that the sense amplifier circuit 1500 communicates with to perform sense operations. For example, other latches may include data latches configured to store data that is to be programmed into the target memory cell MC(T) or data that is sensed from the target memory cell MC(T). For clarity, the sense amplifier circuit 1500, the ith bit line BL(i), the NAND string 1502 connected to the ith bit line BL(i), and the latch 1508 are referred to as all being associated with each other. Accordingly, reference to the latch 1508 being associated with the ith bit line BL(i) means that the latch 1508 is connected to the same sense amplifier circuit 1500 as the ith bit line BL(i).

The latch 1508, which can also be referred to as a latch circuit, an auxiliary latch or an auxiliary latch circuit, may be configured to generate and output state-dependent voltages, including a select voltage $V_S$ at a select node S and an unselect voltage $V_U$ at an unselect node U. The latch 1508 may be configured to generate each of the select voltage $V_S$ and the unselect voltage $V_U$ at an associated high voltage level or an associated low voltage level. The select and unselect voltages $V_S$, $V_U$ may be inverses of each other, meaning that when the latch 1508 generates one at an associated high voltage level, it generates the other at an associated low voltage level.

The select and unselect voltages $V_S$, $V_U$ are state-dependent in that their respective voltage levels may each indicate whether the associated bit line is selected or unselected and/or whether the associated sense amplifier circuit is selected or unselected. For example, the latch circuit 1508 may be configured to generate each of the select and unselect voltages $V_S$, $V_U$ at a first level or a second level. During a sense operation, when the bit line is a selected bit line, the latch circuit 1508 generates the select voltage $V_S$ is at the first voltage level and the unselect voltage $V_U$ at the second voltage level. When the bit line is an unselected bit line, the latch circuit 1508 generates the select voltage $V_S$ at the second voltage level and the unselect voltage at the first voltage level. In particular example configurations, the first voltage level is the associated high voltage level and the second voltage level is the associated low voltage level, although other configurations where the first voltage level is the associated low voltage level and the second voltage level is the associated high voltage level may be possible.

The sense circuit controller 1406 of FIG. 14 may be configured to output or more latch input control signals to the latch circuit 1508 to configure the latch circuit 1508 in a select or non-lockout state or an unselect or lockout state. For a given verification operation, the sense circuit controller 1406 may determine whether the associated sense amplifier circuit is to be a selected or non-lockout sense amplifier circuit (i.e., configured in the non-lockout mode) or an unselected or lockout sense amplifier circuit (i.e., configured in the lockout mode). In response to determining that the associated sense amplifier circuit is to be a selected or non-lockout sense amplifier circuit, the sense circuit controller 1406 may output the latch control signal(s) to configure the latch circuit 1308 in the selected state. In response, the latch circuit 1308 may output the select and unselect voltages $V_S$, $V_U$ each at respective select voltage levels. In a particular example configuration, the select voltage level of the select voltage $V_S$ is an associated high voltage level (e.g., 1 V) and the select voltage level of the unselect voltage $V_U$ is an associated low voltage level (e.g., 0 V). Alternatively, in response to determining that the associated sense amplifier circuit is to be an unselected or lockout sense amplifier circuit, the sense circuit controller 1406 may output the latch control signal(s) to configure the latch circuit 1308 in the unselected state. In response, the latch circuit 1308 may output the select and unselect voltages $V_S$, $V_U$ each at respective unselect voltage levels. In a particular example configuration, the unselect voltage level of the select voltage $V_S$ is an associated low voltage level (e.g., 0 V), and the unselect voltage level of the unselect voltage $V_U$ is an associated high voltage level (e.g., 1 V).

Since select and unselect voltages $V_S$, $V_U$ are state-dependent, one or both of them may be used as the state-dependent control signal CTRLD (or the lockout signal) that indicates whether the associated bit line is selected or unselected, the sense amplifier circuit is selected or unselected, and/or that the sense amplifier is locked out. In the example configurations described with reference to FIGS. 12B, 12C, 13B, and below in FIGS. 15A and 15B, the unselect voltage $V_U$ may be the state-dependent control signal CTRLD that is used to generate the state-dependent, modified sense enable control signals CTRLS_M and/or to activate (turn on) the drain circuitry in unselected sense amplifiers while deactivating (turning off) the drain circuitry in selected sense amplifiers.

In addition, the sense amplifier circuit 1500 may include a bit line connection circuit 1528 that is configured to electrically connect and disconnect the ith bit line BL(i) from the sense amplifier circuit 1500 and the latch 1508. When the bit line connection circuitry 1528 connects the ith bit line BL(i) to the sense amplifier circuit 1500, current may flow from the sense amplifier circuit 1500 to the ith bit line BL(i). Alternatively, when the bit line connection circuitry disconnects the ith bit line BL(i) from the sense amplifier circuit 1500, current may be prevented from flowing from the sense amplifier circuit 1500 to the ith bit line BL(i).

In addition, the sense amplifier circuit 1500 may include a bit line biasing circuit 1530 that is configured to bias the ith bit line BL(i) by generating a bit line bias voltage $V_{BL}$ at a bit line bias node VBL. The amount of the bit line bias voltage $V_{BL}$ may depend on whether the ith bit line BL(i) is a selected bit line or an unselected bit line. In particular, when the ith bit line BL(i) is a selected bit line, the bit line biasing circuit 1530 may set the bit line bias voltage $V_{BL}$ to the high supply voltage level VHSA or a level corresponding to the high supply voltage VHSA, and when the ith bit line BL(i) is an unselected bit line, the bit line biasing circuit 1528 may set the bit line bias voltage $V_{BL}$ to the cell source voltage level Vcelsrc or a level corresponding to the cell source voltage Vcelsrc.

The sense amplifier circuit 1500 may further include a sense enable circuit 1532 having a first end or terminal connected to a sense node SEN and a second end or terminal connected to a communication node (COM). The sense enable circuit 1532 is configured to be enabled and disabled. When enabled, the sense enable circuit 1532 may form a charge-sharing relationship between a sense node SEN and a communication node COM in that, by way of the sense enable circuit 1532, the communication node COM and the sense node SEN are able to share charge they have respectively accumulated prior to the sense enable circuit 1532 being enabled. If a difference in voltage between a communication voltage $V_{COM}$ generated on the communication node COM and a sense voltage $V_{SEN}$ generated on the sense node SEN exists when the sense enable circuit 1532 is disabled, then when sense enable circuit 1532 enables, a current flow of the charge accumulated on the sense node SEN and/or the communication node COM may flow between the sense node SEN and the communication node COM in accordance with the voltage difference and as a result of the charge-sharing relationship formed by the sense enable circuit 1532. Alternatively, when the sense enable circuit 1532 is disabled (not enabled), the sense enable circuit 1532 prevents a charge sharing relationship from forming between the sense node SEN and the communication node COM. When the sense enable circuit 1532 is disabled, the sense enable circuit 1532 isolates the communication node COM from the sense node SEN.

The sense amplifier circuit 1500 may further include a sense capacitor or other charge-storing circuit 1558. In general, the charge-storing circuit 1558 is any type of circuit component or combination of circuit components configured to store charge and generate a voltage based on the stored charge. An example configuration of the charge-storing circuit 1558 may be a capacitor, although other circuits or combinations of circuits, including active circuits, passive circuits, or combinations thereof, may be implemented as the charge-storing circuit 1558. The charge-storing circuit 1558 may include a first end or terminal connected to the sense node SEN and a second end or terminal connected to a clock node CLK. In this regard, the configuration comprises sense capacitor charge circuitry configured to precharge sense capacitors, such as charge storing circuit 1558.

As previously described, a sense operation may be performed on a group of target memory cells of a block that are connected to the same word line as part of a given read operation or a given verify operation (or a verify portion of a program-verify operation). For the given read operation, the target memory cells are those memory cells in a block from which data values of data are to be determined. For the given verify operation, the target memory cells are those memory cells in a block into which data is being programmed. One or more of the sense blocks 146 shown in FIG. 2B may be involved in one or more sense operations that are part of the given read operation or the given verify operation. In a single sense operation for the given read operation or the given verify operation, some sense circuits 1402 (FIG. 14) of the one or more sense blocks 146 involved in the one or more sense operations may be connected to selected bit lines while other sense circuits 1402 of the one or more sense blocks 146 may be connected to unselected bit lines. For the single sense operation, a sense circuit controller 1406 (FIG. 14) and/or the control logic 154 (FIG. 2B) may want to know whether current, or a threshold amount of current, is conducting through the selected bit lines. The sense circuit controller 1406 and/or the control logic 154 may not want to know whether current, or the threshold amount of current, is conducting through the unselected bit lines.

The control logic 154 and/or one or more of the sense circuit controllers 1406 of the sense blocks 146 may be configured to select which of the bit lines connected to the target memory cells are to be selected bit lines and which are to be unselected bit lines for the single sense operation. For a given read operation, the control logic 154 and/or the one or more sense circuit controllers 1406 may identify the selected and unselected bit lines according to a predetermined read scheme that is used in order to identify the threshold voltages $V_{TH}$ of the memory cells, and in turn the data values of the data the target memory cells are storing. For a given verify operation, the control logic 154 and/or the one or more sense circuit controllers 1206 may identify the selected and unselected bit lines according to a program scheme that is used to program the target memory cells into various, different programmed states.

In accordance with at least some example program schemes, a single sense operation may be associated with a given memory state. For the single sense operation, the control logic 154 and/or the one or more sense circuit controllers 1206 may identify a bit line to be a selected bit line if the target memory cell connected to the bit line is assigned to be programmed into the given memory state associated with the single sense operation. Conversely, the control logic 154 and/or the one or more sense circuit controllers 1206 may identify a bit line to be an unselected bit line if the target memory cell is not assigned to be programmed into the given memory state associated with the single sense operation. Also, as previously described, if a given target memory cell is assigned to be programmed into the given memory state, and the target memory cell is already sufficiently programmed, the control logic 154 and/or the one or more sense circuit controller 1206 may identify that target memory cell as locked out, and in turn the bit line connected that target memory cell as being an unselected or locked out bit line.

For a given sense operation, where the ith bit line BL(i) is identified as a selected bit line, the sense amplifier circuit 1500 is referred to as a selected or non-lockout sense amplifier circuit. On the other hand, where the ith bit line BL(i) is identified as an unselected or locked out bit line, the sense amplifier circuit 1500 is referred to as an unselected or locked-out sense amplifier circuit.

During a sense operation, the sense circuit controller 1406 is configured to output a clock signal CLKSA that includes clock voltage pulses to the clock node. If the sense amplifier circuit 1500 is a selected or non-lockout sense amplifier during the sense amplifier, in response to a clock voltage pulse of the clock signal CLKSA, the sense capacitor 1558 accumulates charge in the sense node SEN, resulting in an increase in the voltage level of the sense voltage $V_{SEN}$. During this time, the sense enable circuit 1532 is disabled, causing the sense node SEN to maintain the sense voltage $V_{SEN}$ at the increased voltage level for a certain time period. Following the time period, the sense circuit 1532 is enabled, forming the charge-sharing relationship between the sense node (SEN) and the communication node (COM) and allowing current to flow from the sense node (SEN), through the enabled sense enable circuit 1532, through the communication node (COM), through the bit line connection circuit 1528, and drawn through the ith bit line BL(i). The amount of the current drawn though the ith bit line BL(i) determines a status of the target memory cell MC(T).

The sense amplifier circuit 1500 further includes a sense detection circuit 1534 configured to detect the amount of current flow through the ith bit line BL(i) when the sense amplifier circuit 1500 is a selected sense amplifier circuit. In response to the detection, the sense detection circuit 1534 may generate and output the sense result signal $V_{SR}$ on the communication bus (BUS) at a level, such as a voltage level, indicative of the amount of the current flow, and in turn a status of the target memory cell MC(T), as previously described.

Referring particularly to FIG. 15A, the sense enable circuit 1532 is configured to be controlled by an isolation control signal circuit 1570, which may be configured as the sense node isolation control circuitry 1210 as described with reference to FIG. 12B or as the multiplexer 1232 as described with reference to FIG. 12C. The isolation control signal circuit 1570 is configured to generate and output a modified sense enable control signal CTRLS_M to enable and disable the sense enable circuit. In one implementation, isolation control signal circuit 1570 is part of the sense circuit controller 1406, although in other implementations it may be considered separate from the sense circuit controller 1406 and/or part of the sense amplifier circuit 1500. As described above, a sense voltage $V_{SEN}$ generated at a sense node SEN may increase due to charge accumulated at the sense node SEN, such as in response to a voltage pulse of a clock signal CLKSA received at a clock node CLK during a verification operation, such as a verification operation conducted to verify whether the target memory cell MC(T) is sufficiently programmed.

During a given verification operation, the isolation control signal circuit 1570 may output the modified sense enable control signal CTRLS_M to enable and disable the sense enable circuit 1532 in a state-dependent manner. That is, the voltage waveform of the modified sense enable control signal CTRLS_M during the verification operation depends on whether the sense amplifier circuit 1500 is a selected/non-lockout sense amplifier circuit or an unselected/lockout sense amplifier circuit. When the sense amplifier circuit 1500 is a selected sense amplifier circuit, the isolation control signal circuit 1570 may output the modified sense enable control signal CTRLS_M at certain times during the verification operation such as during the low and high verification portions VL-sense, VH-sense, to enable the sense enable circuit 1532, allowing current resulting from the charge accumulated at the sense node SEN to flow through the sense enable circuit 1532 and the bit line connection circuit 1528 to the ith bit line BL(i) via the communication node COM so that the sense amplifier circuit 1500 is able to sense the status of the target memory cell MC(T). When the sense circuit is an unselected sense amplifier circuit, the isolation control signal circuit 1570 generates the modified sense enable control signal CTRLS_M to disable or to turn off the sense enable circuit 1532 during an entire duration of the verification operation, including the low and high verification portions when the sense enable circuit 1532 in the unselected sense amplifier circuit would be typically enabled. Accordingly, when the sense amplifier circuit 1500 is an unselected sense amplifier, the isolation control signal circuit 1570 disables the sense enable circuit 1532, thereby blocking movement of charge accumulated at the sense node SEN through the sense enable circuit 1532 and the bit line connection circuit 1528 to the ith bit line BL(i) during a sense operation.

As shown in FIG. 15A, the isolation control signal circuit 1570 receives as inputs the universal sense enable control signal CTRLS and the unselect voltage $V_U$ from the latch circuit 1508. The unselect voltage $V_U$ may be representative of the state-dependent control signal CTRLD as previously described with reference to FIGS. 12B and 12C. The universal sense enable control signal CTRLS and the unselect voltage $V_U$ may be pre-existing signals and voltages generated within a sense block 146. Accordingly, by configuring the sense amplifier circuit 1500 to have the isolation control signal circuit 1570, the sense circuit controller 1406 can still output the same universal sense enable control signal CTRLS to all of the sense circuits coupled to the target memory cells, regardless of whether the sense amplifier circuits are selected or unselected, just as it did before. However, now, only those sense enable circuits 1532 that are part of selected sense amplifier circuits will be enabled during verification operation due to the state-dependent nature of the modified sense enable control signal CTRLS_M that each of the isolation control signal circuits 1570 directly apply to their respective sense enable circuits 1532.

If the isolation control signal circuits 1570 were not included in FIG. 15A, either the unselected/lockout sense amplifier circuits would continue to undesirably transmit noise to the communication nodes as is currently the case, or as an alternative, the sense circuit controller 1406 would have to be specially configured with switching circuitry that would allow the sense circuit controller 1406 to selectively and dynamically output the sense enable control signal CTRLS to only the selected sense amplifier circuits while outputting a different sense enable control signal that maintains the sense enable circuits of the unselected/lockout sense amplifier circuits in unselected states during the sense operation. As a single sense circuit controller 1406 may control hundreds or thousands of sense amplifier circuits at a time for a single sense operation, and different sense amplifiers are selected and unselected for different sense operations, implementing such switching circuitry to give the sense circuit controller 1406 dynamic state-dependent control of the sense enable circuits could be complex, costly, and perhaps infeasible given size requirements of the memory die. Conversely, implementing the isolation control signal circuits 1570 provides a solution that is easier to implement and more cost-effective while achieving the same noise-reducing results.

Referring to FIG. 15B, instead of having an isolation control signal circuit 1570, the sense amplifier circuit 1590 includes a drain sense node circuit 1580 that drains charge accumulated on the sense node SEN when such charge accumulates in response to the sense capacitor 1558 receiving a voltage pulse of a clock signal CLKSA. The drain sense node circuit 1580 may have the NMOS configuration of the sense node drain circuitry 1322 as previously described with reference to FIG. 13B. As previously described, rather than apply a modified sense enable control signal CTRLS_M to the sense enable circuits 1532, the sense circuit controller 1406 will output the same sense enable control signal CTRLS to all of the sense enable circuits 1532 subject to the same sense operation, but the sense voltages $V_{SEN}$ generated on the sense nodes (SEN) will be state-dependent. Accordingly, during a sense operation, even though the sense enable circuits 1532 in unselected/lockout sense amplifier circuits 1590 enable to form a current-sharing relationship between the sense node (SEN) and the communications node (COM), and even though the clock nodes (CLK) in the unselected/lockout sense amplifier circuits 1590 will receive pulses of the clock signal CLKSA, the sense nodes (SEN) will not have accumulated charge for the sense enable circuits 1532 in the unselected/lockout sense amplifier 1590 to transmit to the communication nodes (COM).

A means for charging a sense node of a sense amplifier circuit, in various embodiments, may include the charge-storing circuit 1108, a capacitor, or the like. Other embodiments may include similar or equivalent means for charging a sense node of a sense amplifier circuit.

A means for isolating the sense node from a communication node of the sense amplifier circuit may include the sense enable circuit 1104, a transistor, a NMOS transistor, a pass transistor, or the like. Other embodiments may include similar or equivalent means for isolating the sense node from the communication node.

A means for controlling the means for isolating the sense node from the communication node, the means for controlling dependent on the sense amplifier circuit connected to an unselected bit line, may include the sense isolation control circuitry 1210, a level shifter coupled to an inverter, the multiplexer 1232, or the like. Other embodiments may include similar or equivalent means for controlling the means for isolating.

It is intended that the foregoing detailed description be understood as an illustration of selected forms that the invention can take and not as a definition of the invention. It is only the following claims, including all equivalents, that are intended to define the scope of the claimed invention.

Finally, it should be noted that any aspect of any of the preferred embodiments described herein can be used alone or in combination with one another.

We claim:

1. A circuit comprising:
   a sense amplifier circuit to connect to an unselected bit line, the sense amplifier circuit comprising:
   sense node charge circuitry to charge a sense node;
   isolation circuitry to isolate the sense node from a communication node; and
   sense node isolation control circuitry to control the isolation circuitry in order to isolate the sense node from the communication node,
   wherein the sense node isolation control circuitry comprises a multiplexer that receives a lockout signal at a select input and outputs a state-dependent control signal based on a level of the lockout signal to control the isolation circuitry.

2. The circuit of claim 1, wherein the lockout signal is a bit line biasing control signal.

3. The circuit of claim 1, wherein a voltage level of the lockout signal is based upon the voltage level of the sense amplifier circuit in a lockout mode or a non-lockout mode.

4. The circuit of claim 3, wherein the voltage level of the sense amplifier circuit in the lockout mode is at a high voltage level, and wherein the voltage level of the sense amplifier circuit in the non-lockout mode is at a low voltage level.

5. The circuit of claim 1, further comprising a latch circuit in communication with the sense amplifier circuit, wherein the latch circuit:
   generates a state-dependent voltage in response to the sense amplifier circuit connected to the unselected bit line; and
   outputs the state-dependent voltage as the lockout signal to the sense node isolation control circuitry.

6. The circuit of claim 5, wherein the state-dependent voltage comprises an unselect voltage, and wherein the latch circuit;
   generates the unselect voltage at an associated high level in response to the sense amplifier circuit connected to the unselected bit line; and
   generates the unselect voltage at an associated low level in response to the sense amplifier circuit connected to a selected bit line.

7. A circuit comprising:
   a sense amplifier circuit to connect to an unselected bit line, the sense amplifier circuit comprising:
   sense node charge circuitry to charge a sense node;
   a sense enable circuit to form a charge-sharing relationship between the sense node and a communication node; and
   sense node drain circuitry to drain charge at the sense node in response to the sense node charge circuitry receiving a voltage pulse and dependent on the sense node charge circuitry charging the sense node and connection of the sense amplifier circuit to the unselected bit line.

8. The circuit of claim 7, wherein the sense node drain circuitry is connected between the sense node and the sense enable circuit.

9. The circuit of claim 8, wherein the sense node drain circuitry comprises a first terminal connected between the sense node and the sense enable circuit and a second terminal connected to ground.

10. The circuit of claim 7, further comprising a latch circuit in communication with the sense amplifier circuit, the latch circuit:
    generates a lockout signal indicative of locking out the sense amplifier circuit; and
    activates the sense node drain circuitry with the lockout signal.

11. The circuit of claim 10, wherein the sense node drain circuitry comprises a transistor, and wherein the latch circuit inputs the lockout signal to a gate of the transistor.

12. The circuit of claim 10, wherein the lockout signal comprises an unselect voltage, the latch circuit configured to generate the unselect voltage at an associated high voltage level in response to the sense amplifier circuit connected to the unselected bit line.

13. The circuit of claim 7, wherein the sense node charge circuitry is configured to electrically connect the sense node to ground prior to receipt of the voltage pulse.

14. A system comprising:
    a plurality of sense circuits, wherein each sense circuit of the plurality of sense circuits is configured to connect to a respective one of a plurality of bit lines of a memory block, wherein the plurality of sense circuits comprises:
    a first sense amplifier circuit comprising:
       a first sense capacitor; and
       circuitry configured to connect the first sense capacitor to a selected bit line of the plurality of bit lines during a sense operation; and
    a second sense amplifier circuit comprising:
       a second sense capacitor;
       circuitry configured to connect the second sense capacitor to an unselected bit line of the plurality of bit lines during the sense operation; and
       a drain transistor configured to drain the second sense capacitor dependent on connecting the second sense amplifier circuit to the unselected bit line and charging the second sense capacitor.

15. The system of claim 14, wherein the second sense capacitor is configured to receive a voltage pulse during the sense operation, and
    wherein the drain transistor is configured to drain the second sense capacitor in response to receipt of the voltage pulse.

16. The system of claim 14, wherein the drain transistor is configured to drain the second sense capacitor in response to receipt of a second control signal.

17. The system of claim 16, further comprising a latch circuit configured to generate the second control signal.

18. The system of claim 17, wherein the drain transistor comprises a first drain transistor, and wherein the first sense amplifier circuit further comprises a second drain transistor configured to turn off in response to receipt of a first control signal.

* * * * *